(12) United States Patent
Kanome et al.

(10) Patent No.: US 9,233,558 B2
(45) Date of Patent: Jan. 12, 2016

(54) ELECTROSTATIC ADSORPTIVE BELT AND METHOD OF MANUFACTURING THEREOF, ASSEMBLY, AND CONVEYANCE SYSTEM

(71) Applicant: CANON COMPONENTS, INC., Saitama-ken (JP)

(72) Inventors: Osamu Kanome, Saitama-ken (JP); Taisuke Iwashita, Saitama-ken (JP)

(73) Assignee: CANON COMPONENTS, INC. (JP)

( * ) Notice: Subject to any disclaimer, the term of this patent is extended or adjusted under 35 U.S.C. 154(b) by 0 days.

(21) Appl. No.: 14/531,165

(22) Filed: Nov. 3, 2014

(65) Prior Publication Data
US 2015/0124040 A1    May 7, 2015

(30) Foreign Application Priority Data

| Nov. 5, 2013 | (JP) | ................. | 2013-229761 |
| Nov. 5, 2013 | (JP) | ................. | 2013-229763 |
| Oct. 28, 2014 | (JP) | ................. | 2014-219664 |

(51) Int. Cl.

| *B41J 2/385* | (2006.01) |
| *B41J 11/00* | (2006.01) |
| *H01L 21/677* | (2006.01) |
| *H01L 21/683* | (2006.01) |
| *H05K 3/10* | (2006.01) |

(Continued)

(52) U.S. Cl.
CPC ........... *B41J 11/007* (2013.01); *H01L 21/6776* (2013.01); *H01L 21/67706* (2013.01); *H01L 21/6831* (2013.01); *H05K 3/107* (2013.01); *H05K 3/187* (2013.01); *H05K 3/26* (2013.01); *H05K 3/281* (2013.01); *H05K 3/381* (2013.01); *H05K 2203/087* (2013.01); *H05K 2203/107* (2013.01)

(58) Field of Classification Search
USPC ............... 347/4, 16, 101, 103–107, 120, 139; 271/4.01, 193, 275–276; 399/310, 313, 399/333; 400/635
See application file for complete search history.

(56) References Cited

U.S. PATENT DOCUMENTS

| 5,315,324 | A | * | 5/1994 | Kubelik | ................... | B41J 2/415 |
| | | | | | | 347/120 |
| 5,821,968 | A | * | 10/1998 | Ohyama | .............. | B41J 11/0005 |
| | | | | | | 347/104 |

(Continued)

FOREIGN PATENT DOCUMENTS

| JP | 9254460 A | 9/1997 |
| JP | 2002218776 A | 8/2002 |

(Continued)

OTHER PUBLICATIONS

Japanese Office Action issued in counterpart application No. JP2014-219664, dated Oct. 2, 2015. Partial English translation provided.

*Primary Examiner* — Kristal Feggins
(74) *Attorney, Agent, or Firm* — Rossi, Kimms & McDowell LLP

(57) ABSTRACT

There is provided with a method of manufacturing an electrostatic adsorptive belt. A portion for forming an electrode pattern on a first resin layer is irradiated with an ultraviolet laser beam. A region including the portion for forming the electrode pattern on the first resin layer is oxidated. The electrode pattern if formed on the first region layer by plating. A second resin layer is formed on a surface of the first resin layer on which the electrode pattern is formed.

8 Claims, 12 Drawing Sheets

(51) Int. Cl.
*H05K 3/18* (2006.01)
*H05K 3/26* (2006.01)
*H05K 3/28* (2006.01)
*H05K 3/38* (2006.01)

(56) References Cited

U.S. PATENT DOCUMENTS 6,379,002 B1 * 4/2002 Kodama ................. B41J 11/007
 347/101
7,884,840 B2 * 2/2011 Sohmiya ............... G03G 15/238
 347/171
8,303,105 B2 * 11/2012 Kato ....................... B65H 5/004
 347/104
8,651,605 B2 * 2/2014 Ito ........................ B41J 11/0015
 347/101

FOREIGN PATENT DOCUMENTS

JP 2005169968 A 6/2005
JP 2005294700 A 10/2005

* cited by examiner

F I G. 3
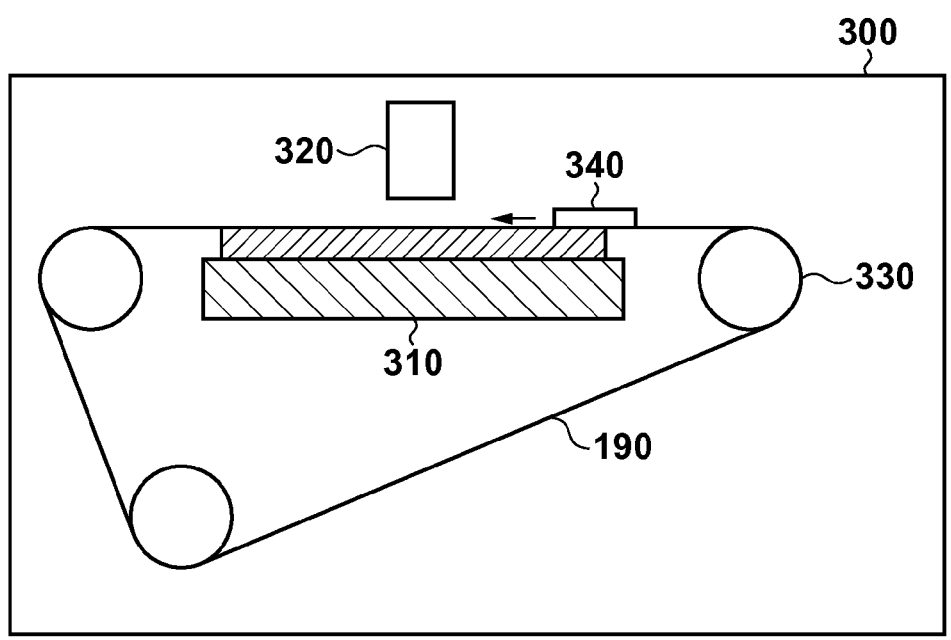

FIG. 11

| PATTERN | 1 | 2 | 3 | 4 | 5 | 6 | 7 | 8 | ADSORPTIVE FORCE EVALUATION RESULT | | |
|---|---|---|---|---|---|---|---|---|---|---|---|
| | | | | | | | | | PAPER A | PAPER B | PAPER C |
| a | + | − | + | − | + | − | + | − | ○ | △ | × LARGE CURRENT |
| b | + | + | − | − | + | + | − | − | ○ | △ | △ |
| c | + | + | + | N | − | − | − | N | △ | ○ | △ |
| d | + | + | N | N | − | − | N | N | × | △ | ○ |
| e | + | + | + | + | − | − | − | − | △~× | △ | △ |

+ : +1 kV APPLIED  
− : −1 kV APPLIED  
N : NO VOLTAGE APPLIED  
○ : SATISFACTORY  
△ : MEDIUM  
× : UNSATISFACTORY

ELECTROSTATIC ADSORPTIVE BELT AND METHOD OF MANUFACTURING THEREOF, ASSEMBLY, AND CONVEYANCE SYSTEM

BACKGROUND OF THE INVENTION

1. Field of the Invention

The present invention relates to an electrostatic adsorptive belt and a method of manufacturing thereof, an assembly, and a conveyance system.

2. Description of the Related Art

To convey a printing medium in a printing device or the like, an electrostatic adsorptive belt which adsorbs a medium by an electrostatic adsorptive force and conveys it is used. The electrostatic adsorptive belt can be fabricated by forming a conductive layer having a desired pattern on a resin base and covering the conductive layer with a resin insulating layer. A power supply is connected to the conductive layer to charge the surface of the insulating layer, and the electrostatic adsorptive belt adsorbs a medium by the charges.

As a method of manufacturing an electrostatic adsorptive belt, Japanese Patent Laid-Open No. 2002-218776 has disclosed a method of adhering copper foil to a vinyl chloride resin, applying a resist in accordance with a desired pattern, etching the copper foil, and further adhering a vinyl chloride resin plate.

SUMMARY OF THE INVENTION

According to an embodiment, a method of manufacturing an electrostatic adsorptive belt comprises: irradiating, with an ultraviolet laser beam, a portion for forming an electrode pattern on a first resin layer; oxidating a region including the portion for forming the electrode pattern on the first resin layer; forming the electrode pattern on the first region layer by plating; and forming a second resin layer on a surface of the first resin layer on which the electrode pattern is formed.

According to another embodiment, an assembly comprises an electrostatic adsorptive belt, wherein the electrostatic adsorptive belt comprises: an integrally formed first resin layer having a recess in a surface; an electrode pattern formed in the recess of the first resin layer; and a second resin layer laminated on a surface of the first resin layer on which the electrode pattern is formed.

According to still another embodiment, an assembly comprises an electrostatic adsorptive belt, wherein the electrostatic adsorptive belt comprises a first resin layer, a second resin layer, an electrode pattern sandwiched between the first resin layer and the second resin layer, and a power feeder which is connected to the electrode pattern and extends through the first resin layer, the electrode pattern includes first to Nth (N≤3) electrodes, and the first to Nth electrodes are connected to first to Nth power feeders, respectively, and positions of the first to Nth power feeders in a widthwise direction of the electrostatic adsorptive belt are different.

According to yet another embodiment, an assembly comprises an electrostatic adsorptive belt, wherein the electrostatic adsorptive belt comprises an electrode pattern including a plurality of electrodes, and an inside of each of the electrodes is partially hollowed.

According to still yet another embodiment, an assembly comprises an electrostatic adsorptive belt, wherein the electrostatic adsorptive belt comprises an electrode pattern including a plurality of electrodes, and each of the electrodes is constituted by a thin line having a width of not larger than 1.0 mm.

According to yet still another embodiment, an assembly comprises an electrostatic adsorptive belt, wherein the electrostatic adsorptive belt comprises an electrode pattern including a plurality of electrodes arranged on the same surface, and a plurality of conductive films, the plurality of electrodes include first and second electrodes adjacent to each other in a lengthwise direction of the electrostatic adsorptive belt, and a first conductive film is adjacent to the first electrode in a widthwise direction of the electrostatic adsorptive belt, and adjacent to the second electrode in a lengthwise direction of the electrostatic adsorptive belt.

According to still yet another embodiment, a conveyance system comprises: an electrostatic adsorptive belt including first to Nth (N≤3) electrodes; a driving unit constructed to drive the electrostatic adsorptive belt; and a voltage application unit constructed to determine voltages to be applied to the respective electrodes, and selectively apply the determined voltages to the corresponding electrodes.

Further features of the present invention will become apparent from the following description of exemplary embodiments (with reference to the attached drawings).

BRIEF DESCRIPTION OF THE DRAWINGS

FIG. 3 is a schematic view showing a printing apparatus according to the first embodiment.

FIG. 11 is a table showing an example of a combination pattern of voltages to be applied to electrodes.

DESCRIPTION OF THE EMBODIMENTS

The method described in Japanese Patent Laid-Open No. 2002-218776 has problems in terms of the environmental load and cost because copper foil needs to be etched away, and the resist also needs to be removed by a solvent, heating steam, or the like. An electrostatic adsorptive belt obtained by the method described in Japanese Patent Laid-Open No. 2002-218776 has a problem in that the belt surface becomes uneven owing to the thickness of the conductive layer to decrease the adsorptive force and generate vibrations.

One embodiment of the present invention can provide a highly flat electrostatic adsorptive belt that can be manufactured by a method which reduces the environmental load.

Embodiments to which the present invention is applicable will be described with reference to the drawings. However, the scope of the present invention is not limited to the following embodiments.

First Embodiment

Figure 5:
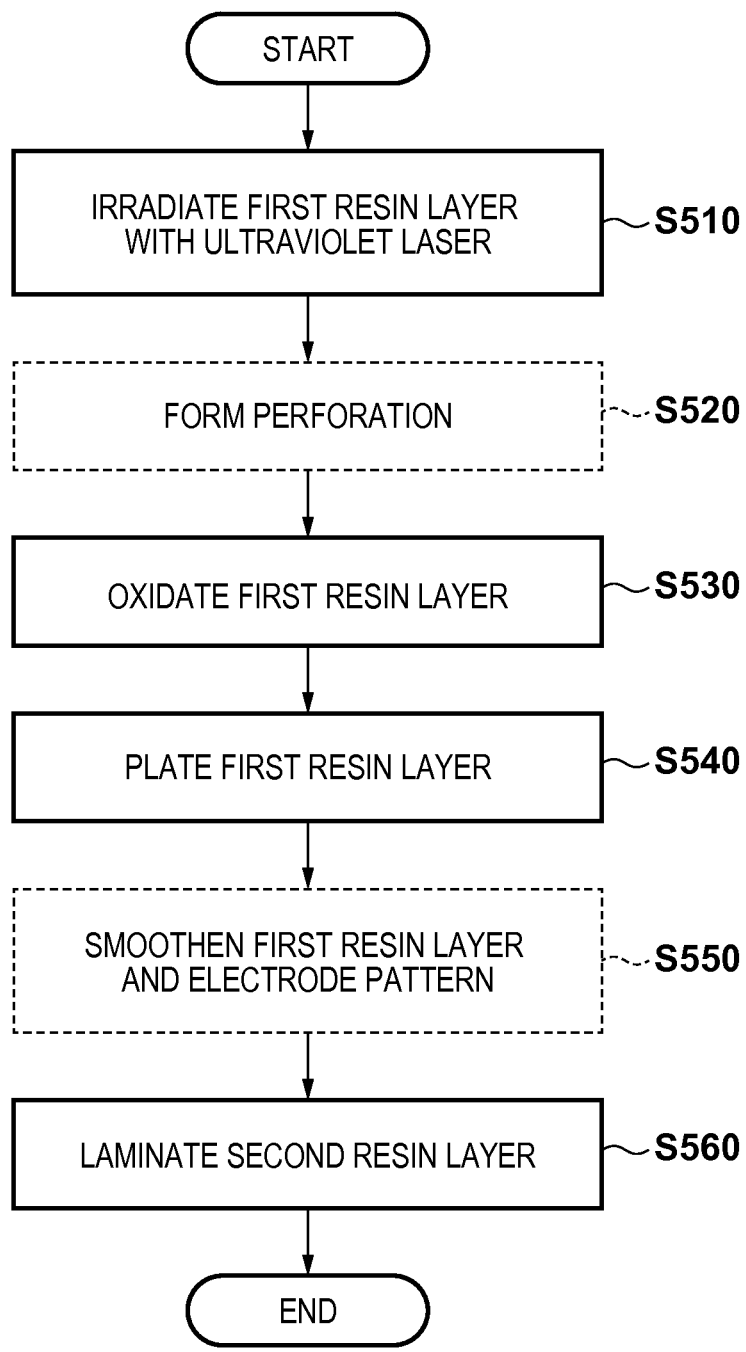
FIG. 5 is a flowchart showing the method of manufacturing the electrostatic adsorptive belt according to the first embodiment.

An electrostatic adsorptive belt 190 on which a predetermined electrode pattern is formed is manufactured in one embodiment of the present invention. A manufacturing method according to this embodiment includes an irradiation step, oxidation step, plating step, and lamination step. In the manufacturing method according to this embodiment, at least one of a perforation forming step and smoothing step may also be performed. These steps will be explained in detail with reference to the sectional view of FIGS. 1A-E and the flowchart of FIG. 5.

Irradiation Step

Figure 1A:
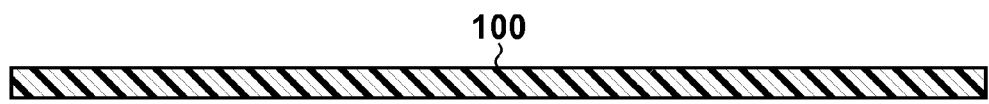
FIGS. 1A to 1E are views for explaining a method of manufacturing an electrostatic adsorptive belt according to the first embodiment.
Figure 1B:
Figure 2:
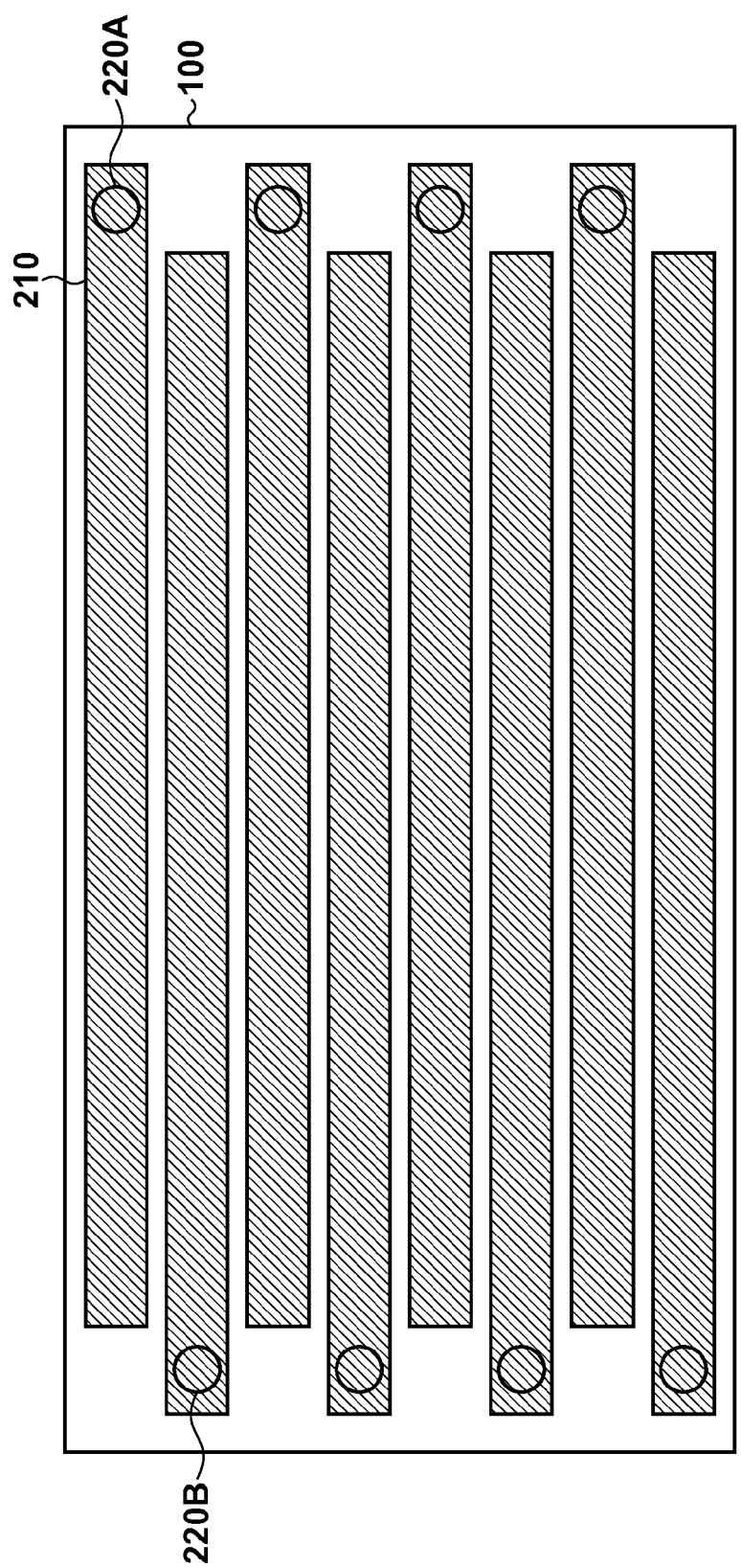
FIG. 2 is a view showing positions where an electrode pattern and perforation are formed according to the first embodiment.

In step S510, the irradiation step is performed. In the irradiation step, portions for forming electrode patterns on the first resin layer (on a first resin layer 100) are irradiated with an ultraviolet laser beam. FIG. 1A shows the first resin layer 100. FIG. 2 is a plan view showing the first resin layer 100. As shown in FIG. 1B and FIG. 2, portions 210 for forming electrode patterns are irradiated with the ultraviolet laser beam, thereby modifying the portions irradiated with the ultraviolet laser beam on the first resin layer 100, and forming recesses 140.

More specifically, when ultraviolet light is emitted, oxygen in an atmosphere is decomposed to generate ozone. Also, bonds in molecules forming the resin are broken on the resin surface. At this time, the molecules forming the resin react with the ozone, thereby oxidating the resin surface, that is, forming a C—O bond, C=O bond, C(=O)—O bond (a skeleton of a carboxyl group), and the like on the resin surface. Hydrophilic groups like these increase the chemical adsorption between the first resin layer 100 and a plating layer. In addition, the oxidation of the surface of the first resin layer 100 forms a fine roughened surface, and increases physical adsorption to the plating layer by an anchoring effect. Furthermore, when electroless plating is performed, catalyst ions can be selectively adsorbed to the modified portion.

The first resin layer 100 is the base of the electrostatic adsorptive belt 190. The material of the first resin layer 100 is not particularly limited as long as the first resin layer 100 has, on the surface, a resin material which can be modified such that a plating metal is selectively deposited on a laser beam-irradiated portion. The first resin layer 100 may be, for example, a resin belt or a resin layer laminated on another material. In one embodiment, an insulating resin belt is used as the first resin layer 100. Examples of the material of the first resin layer 100 are a cycloolefin polymer, polystyrene, polyethylene terephthalate, and polyvinyl chloride. In one embodiment, the resin material is a carbon polymer formed by carbon atoms and hydrogen atoms, and the carbon polymer includes a cycloolefin polymer. The cycloolefin polymer can be, for example, a polymer having a repeating unit indicated by:

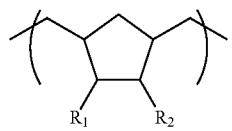

In the above formula, $R_1$ and $R_2$ each independently represent a hydrogen atom or a hydrocarbon group having 1 to 12 carbon atoms. This hydrocarbon group includes, for example, an alkyl group having 1 to 12 carbon atoms. Examples of the alkyl group are a methyl group, ethyl group, and cyclohexyl group. In one embodiment, each of $R_1$ and $R_2$ is a divalent hydrocarbon group having 1 to 12 carbon atoms. This divalent hydrocarbon group includes, for example, a divalent alkyl group having 1 to 12 carbon atoms. Examples of the divalent alkyl group are a 1,3-propanediyl group, 1,3-cyclopentanediyl group, and 5-methylcyclopentane-1,3-diyl group. An example of the cycloolefin polymer is a polymer having one of repeating units A to E below.

| | A | B | C | D | E |
|---|---|---|---|---|---|
| Properties | Crystalline | Amorphous | Amorphous | Amorphous | Amorphous |
| Transparency | Opaque | Transparent | Transparent | Transparent | Transparent |
| Tg/° C. | 134 | 86 | 95 | 150 | 162 |

The cycloolefin polymer may also contain a plurality of repeating units. Also, the resin material may contain a plurality of cycloolefin polymers. The glass transition temperature (Tg) can be adjusted by mixing a plurality of cycloolefin polymers having different Tg's. The cycloolefin polymer to be used in one embodiment is obtained by mixing cycloolefin polymers having any of the above-mentioned repeating units A to E, and its Tg is 160° C. This cycloolefin polymer is mainly formed by a cycloolefin polymer having the above-mentioned repeating unit E.

The cycloolefin polymer indicated by the above formula is formed by carbon atoms and hydrogen atoms. The cycloolefin polymer according to one embodiment is a chemically highly stable substance. The weight-average molecular weight of the cycloolefin polymer is not particularly limited, and is $1\times10^4$ (inclusive) to $1\times10^6$ (inclusive) in one embodiment.

In one embodiment, the first resin layer 100 has a smooth surface. As the surface smoothness of the first resin layer 100 improves, a more uniform plating film is obtained. In one embodiment, an arithmetic average roughness Ra of the surface of the first resin layer 100 is 10 nm or less. In this specification, the arithmetic average roughness Ra is defined by JIS B0601:2001.

The type and wavelength of the ultraviolet laser beam are not particularly limited, and are so selected as to promote the modification of the surface of the first resin layer 100. In one embodiment, the wavelength of the ultraviolet laser beam is 243 nm or less. When the wavelength is 243 nm or less, the modification of the surface of the first resin layer 100 is further promoted.

The ultraviolet laser beam has high-density energy compared to ultraviolet light from an ultraviolet lamp. Therefore, a certain surface modification amount can be obtained within a short time. When irradiation is thus performed within a short time, thermal expansion of the first resin layer 100 is mostly suppressed, so a desired portion of the first resin layer 100 can be accurately modified.

In one embodiment, an excimer laser is used as the ultraviolet laser. The excimer laser is a kind of a gas laser. More specifically, an excited state is generated by instantaneously applying a high voltage to a gas mixture of an inert gas and halogen gas, thereby performing high-output pulse oscillation. The excimer laser beam can modify the surface of the first resin layer 100 within a minimum time without increasing thermal expansion.

The laser beam wavelength changes in accordance with a combination of the inert gas and halogen gas to be used to generate an excimer laser beam. The relationship between the gas combination and the laser beam wavelength is as follows.

$F_2$ excimer laser:wavelength=157 nm
ArF excimer laser:wavelength=193 nm
KrCl excimer laser:wavelength=222 nm In one embodiment, an ArF excimer laser is used as the ultraviolet laser. Since the ArF excimer laser beam has a relatively short wavelength, the surface of the first resin layer 100 is more efficiently modified. Also, the ArF excimer laser is easy to handle because the ArF excimer laser beam is absorbed by the air less than an $F_2$ excimer laser beam.

In one embodiment, a desired portion of the first resin layer 100 is irradiated with the excimer laser beam in the form of a pulse. Thermal expansion of the first resin layer 100 can be suppressed by emitting a pulsed laser beam for a short time period. In one embodiment, the pulse width is 10 (inclusive) to 100 (inclusive) ns. A high-intensity pulsed laser beam is obtained by reciprocating a laser beam in an optical resonator, and extracting the laser beam when a certain time has elapsed.

The laser beam irradiation amount and the number of pulses can be appropriately selected in accordance with the type of the first resin layer 100 and the depth of the recesses 140 to be formed. In one embodiment, a laser beam having an energy density of 80 mJ/cm$^2$ (inclusive) to 1,500 mJ/cm$^2$ (inclusive) per pulse is emitted. In one embodiment, the laser beam is so emitted as to set the cumulative irradiation amount at 1,000 mJ/cm$^2$ (inclusive) to 20,000 mJ/cm$^2$ (inclusive).

In one embodiment, the first resin layer 100 is irradiated with the ultraviolet laser beam in an atmosphere containing at least one of oxygen or ozone. As a practical example, the first resin layer 100 can be irradiated with the ultraviolet laser beam in the air. In another embodiment, the irradiation is performed in an ozone-containing atmosphere in order to further promote modification.

In still another embodiment, the first resin layer 100 can also be irradiated with the ultraviolet laser beam in another gas atmosphere such as an amine compound gas atmosphere or amide compound gas atmosphere. Here, the amine compound includes ammonia. When irradiation is performed in such a gas atmosphere, it is possible to oxidate the resin surface, that is, generate bonds containing nitrogen atoms on the resin surface. More specifically, the resin surface is so modified as to contain nitrogen atoms, and the adsorption to a plating layer improves, so the irradiated portion can be selectively plated. When an object to be processed is isolated from atmospheric-pressure air, the pressure is changed or then a compound gas is sealed, and modification is performed with ultraviolet light, a wavelength suited to the reaction can be selected properly. On the other hand, it is advantageous to emit ultraviolet light having a wavelength of 243 nm or less in an oxygen-containing air because modification can be performed at a low cost.

For example, the first resin layer 100 can be scanned with a laser beam so that portions for forming electrode patterns 110 on the first resin layer 100 are irradiated with the laser beam a predetermined number of times. In this manner, the portions for forming the electrode patterns 110 on the first resin layer 100 can be irradiated with the ultraviolet laser beam. Alternatively, the portions for forming the electrode patterns 110 on the first resin layer 100 can be irradiated with the ultraviolet laser beam by inserting, into the optical system of the ultraviolet laser, a photomask conforming to the shape of the portion to be irradiated with the ultraviolet laser beam.

When the first resin layer 100 is irradiated with the laser beam, the recess 140 is formed in the laser beam-irradiated portion. That is, a surface of the first resin layer 100 in this laser beam-irradiated portion is recessed from a surface of the first resin layer 100 adjacent to the irradiated portion. The depth of the recess 140 can be controlled by changing the irradiation amount. More specifically, as the laser beam energy density is higher and the number of pulses is larger, the recess 140 becomes deeper. In a plating step (to be described later), the electrode pattern 110 is formed in the recess 140. This can smooth the surface of the laminate including the electrode pattern 110 and first resin layer 100.

Perforation Forming Step

Figure 1C:

Power feeders 120 are formed on the electrostatic adsorptive belt 190 to supply electricity to the electrode patterns 110. In one embodiment, metal power feeders 120 are formed to extend through the first resin layer 100, as shown in FIG. 1E. As will be described later with reference to FIG. 3, electricity is supplied to the electrode patterns 110 via the power feeders 120 from power feeding brushes 310 arranged on a surface opposite to the surface on which the electrode patterns 110 of the first resin layer 100 are arranged.

To fabricate the electrostatic adsorptive belt 190, a step of forming perforations 150 for arranging the power feeders 120 is performed in step S520 after the irradiation step in one embodiment. More specifically, as shown in FIG. 1C, the perforations 150 are formed in portions for forming the electrode patterns 110 on the first resin layer 100.

However, the method of feeding power to the electrode patterns 110 is not limited to the method using the power feeders 120. For example, part of the first resin layer 100 may be removed. In this case, electricity can be directly supplied to the electrode patterns 110 from the power feeding brush arranged at an appropriate position. In this case, the step of forming the perforations 150 need not be performed.

In one embodiment, the perforations 150 are formed by using an ultraviolet laser beam. For example, perforations 150A and 150B can be formed by irradiating circular regions 220A and 220B shown in FIG. 2 with the ultraviolet laser beam a plurality of times. The ultraviolet laser can be the same as that used in the irradiation step. The laser beam irradiation amount and the number of pulses can be appropriately selected in accordance with the type and thickness of the first resin layer 100. The perforations 150 can be formed more quickly by using a laser beam having a higher energy density, for example, a laser beam having an energy density of 800 mJ/cm$^2$ (inclusive) to 1,500 mJ/cm$^2$ (inclusive) per pulse.

Oxidation Step

Next, in step S530, an oxidation process is performed on the first resin layer 100 irradiated with the ultraviolet laser beam. More specifically, the oxidation process is performed in a region including the portions for forming the electrode patterns 110 on the first resin layer 100.

Although the surface of the first resin layer 100 is modified by irradiating the surface with the ultraviolet laser beam, the modification is not enough to deposit a plating metal. In the oxidation step, therefore, the surface of the first resin layer 100 is further modified by performing the oxidation process in a region including the portions irradiated with the ultraviolet light. This oxidation process is performed such that in a portion irradiated with the laser beam, the surface modification amount increases to such an extent that a plating metal is deposited, and in a portion not irradiated with the laser beam, the surface modification amount is suppressed to such an extent that no plating metal is deposited.

When the perforations 150 are formed by laser beam irradiation, the side surfaces of the perforations 150 are also modified by the oxidation process. If electroless plating is performed in a plating step (to be described later), a plating metal is deposited even on the side surfaces of the perforations 150.

Practical examples of the oxidation process are a plasma process, an oxidation process using a chemical, and an oxidation process using ultraviolet irradiation. In the following description, the method using ultraviolet light which can be easily performed will be explained. More specifically, the first resin layer 100 is further modified when irradiated with ultraviolet light in an atmosphere containing, for example, oxygen, ozone, nitrogen, or ammonia as in the irradiation step. In this method, a region including portions for forming the electrode patterns 110 is irradiated with the ultraviolet light. Especially in one embodiment, a region including the portions for forming the electrode patterns 110 and wider than the desired portion is irradiated with the ultraviolet light. That is, in the oxidation step, it is not essential to limit the portion to be irradiated with ultraviolet light by using a mask or the like.

If the surface of the first resin layer 100 is irradiated with the ultraviolet light in the case in which the perforations 150 are formed, the ultraviolet light is incident on even the side surfaces of the perforations 150 because of scattering of the ultraviolet light. The side surfaces of the perforations 150 can also be modified by irradiation of the ultraviolet light.

In one embodiment, ultraviolet light having a wavelength of 243 nm or less is emitted. The modification of the surface of the first resin layer 100 is further promoted at the wavelength of 243 nm or less. This ultraviolet light can be emitted by using, for example, an ultraviolet lamp which continuously radiates ultraviolet light. Examples of the ultraviolet lamp are a low-pressure mercury lamp and excimer lamp. The low-pressure mercury lamp can emit ultraviolet light having wavelengths of 185 nm and 254 nm. As reference, examples of the excimer lamp usable in the air will be presented below. An Xe$_2$ excimer lamp is generally used as the excimer lamp.

Xe$_2$ excimer lamp:wavelength=172 nm
KrBr excimer lamp:wavelength=206 nm
KrCl excimer lamp:wavelength=222 nm In the oxidation step of this embodiment, the portions for forming the electrode patterns 110 have already been modified by using the ultraviolet laser beam. Therefore, the irradiation time of the ultraviolet lamp in the oxidation step can be shorter than that when modifying the first resin layer 100 without using the ultraviolet laser beam.

When irradiating the first resin layer 100 with the ultraviolet light, the ultraviolet irradiation is controlled so that the irradiation amount has a desired value. The irradiation amount can be controlled by changing the irradiation time. The irradiation amount can also be controlled by changing, for example, the output of the ultraviolet lamp, the number of ultraviolet lamps, or the irradiation distance. A practical irradiation amount will be described later.

The plating metal deposition conditions can change in accordance with, for example, the type of plating solution, the type of substrate, the degree of contamination on the substrate surface, the concentration, temperature, and deterioration with time of the plating solution, the output fluctuation of the ultraviolet lamp, and defocusing of the excimer laser beam. In this case, it is only necessary to appropriately determine the irradiation amount from the ultraviolet lamp with reference to the above-mentioned numerical values, so that a plating metal is selectively deposited on the laser beam-irradiated portion.

Irradiation Amount

The ultraviolet laser beam irradiation amount in the irradiation step and the ultraviolet irradiation amount in the oxidation step are so adjusted that a plating metal is deposited in a portion irradiated with the ultraviolet laser beam, and no plating metal is deposited in a portion not irradiated with the ultraviolet laser beam. To realize this deposition state, in one embodiment, the ultraviolet laser beam irradiation amount is adjusted such that in a portion irradiated with the laser beam, the oxygen atom existence ratio on the cycloolefin polymer material surface is 3.0% or more, or 3.8% or more after the irradiation step. However, the oxygen atom existence ratio is ignored and is not included in this calculation.

In one embodiment, to deposit a plating metal, the ultraviolet irradiation amount is adjusted so that in a portion irradiated with the laser beam, the oxygen atom existence ratio is 18% or more, or 20.1% or more, after the oxidation step. The oxygen atom existence ratio has no upper limit as long as plating metal deposits in the portion irradiated with the laser beam. Also, to deposit no plating metal, the ultraviolet irradiation amount is adjusted so that in a portion not irradiated with the laser beam, the oxygen atom existence ratio is 15% or less, or 12.6% or less, after the oxidation step. The oxygen atom existence ratio has no lower limit as long as plating metal does not deposit in the portion not irradiated with the laser beam.

In this specification, the oxygen atom existence ratio is the existence ratio (at %) of oxygen atoms to all atoms, which is calculated by XPS measurement. However, the number of hydrogen atoms is not included in this calculation because XPS measurement cannot detect hydrogen atoms. Also, the oxygen atom existence ratio may slightly change due to, for example, the measurement conditions or a detection error of each apparatus.

In one embodiment, to deposit no plating metal in a portion not irradiated with the laser beam, the ultraviolet irradiation amount in the oxidation step is set at 400 mJ/cm² or less at a wavelength of 185 nm. The ultraviolet irradiation amount and irradiation intensity indicate values at the wavelength of 185 nm unless otherwise specified. In one embodiment in which the ultraviolet irradiation intensity is 1.35 mW/cm², the ultraviolet irradiation time in the oxidation step is set to 5 min or less so as not to deposit a plating metal in a portion not irradiated with the laser beam.

Also, in one embodiment in which the oxygen atom existence ratio after the irradiation step in a portion irradiated with the laser beam is 6.5% or more, or 7.1% or more, the ultraviolet irradiation amount in the oxidation step is set at 65 mJ/cm² or more, or 81 mJ/cm² or more, so as to deposit a plating metal in the portion irradiated with the laser beam. In one embodiment in which the ultraviolet irradiation intensity is 1.35 mW/cm², the ultraviolet irradiation time in the oxidation step is set to 0.8 min or more, or 1 min or more, so as to deposit a plating metal in a portion irradiated with the laser beam. For example, when a laser beam having an energy density of 80 mJ/cm² (inclusive) to 150 mJ/cm² (inclusive), or about 100 mJ/cm² is used in the irradiation step, ultraviolet light having an irradiation amount complying with the above-mentioned conditions can be emitted in the oxidation step.

Furthermore, in one embodiment in which the oxygen atom existence ratio after the irradiation step in a portion irradiated with the laser beam is 3.0% or more, or 3.8% or more, the ultraviolet irradiation amount in the oxidation step is set at 200 mJ/cm² or more, or 243 mJ/cm² or more, so as to deposit a plating metal in the portion irradiated with the laser beam. In one embodiment in which the ultraviolet irradiation intensity is 1.35 mW/cm², the ultraviolet irradiation time in the oxidation step is set to 2.5 min or more, or 3 min or more, so as to deposit a plating metal in a portion irradiated with the laser beam. For example, when a laser beam having an energy density of 800 mJ/cm² (inclusive) to 1,500 mJ/cm² (inclusive), or 1,000 mJ/cm² is used in the irradiation step, ultraviolet light having an irradiation amount complying with the above-mentioned conditions can be emitted in the oxidation step.

In one embodiment, when the ultraviolet laser beam is emitted so that the oxygen atom existence ratio after the irradiation step in a portion irradiated with the laser beam is 6.5% or more, or 7.1% or more, the ultraviolet irradiation time in the subsequent oxidation step can be shortened. In one embodiment, the ultraviolet irradiation time in the subsequent oxidation step can be shortened by using a laser beam having an energy density of 80 mJ/cm² (inclusive) to 150 mJ/cm² (inclusive), or 100 mJ/cm².

The oxygen atom existence ratio after the irradiation step in a portion irradiated with the laser beam can be controlled by adjusting the energy density of the laser beam. More specifically, within the range of 100 mJ/cm² to 1,000 mJ/cm², the oxygen atom existence ratio tends to decrease as the energy density increases. Also, the oxygen atom existence ratio after the oxidation step can be controlled by adjusting the ultraviolet irradiation amount. More specifically, the oxygen atom existence ratio tends to increase as the ultraviolet irradiation amount increases.

The above-described irradiation amount is particularly effective when performing electroless copper-nickel plating in a plating step. However, even when a different plating solution or the like is used, the irradiation amounts in the irradiation step and oxidation step can be adjusted based on these findings. That is, the irradiation amounts can be adjusted in accordance with the first resin layer 100, the composition of the plating solution, and the like such that a plating metal is deposited in a portion irradiated with the ultraviolet laser beam, and no plating metal is deposited in a portion not irradiated with the ultraviolet laser beam.

Plating Step

Figure 1D:
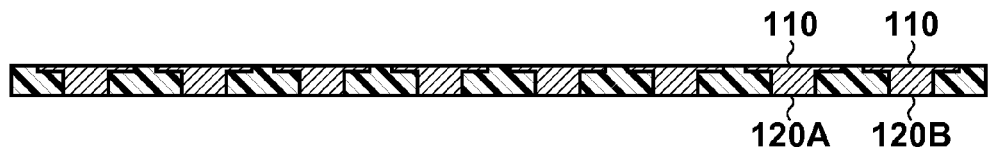
Figure 1E:
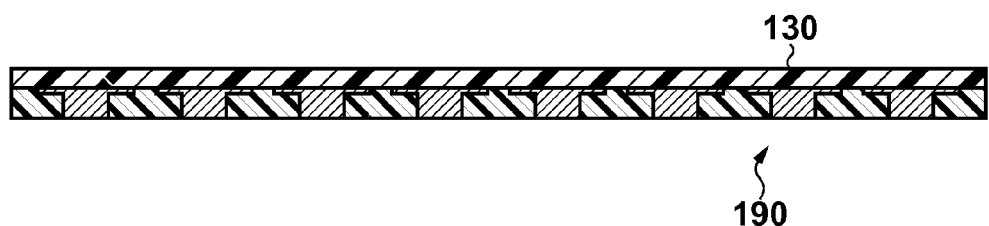

In the plating step of step S540, the electrode patterns 110 are formed on the first resin layer 100 by plating the first resin layer 100, as shown in FIG. 1D. According to this embodiment, a plating metal is selectively deposited in a portion irradiated with the ultraviolet laser beam on the first resin layer 100. It is not essential to pattern a metal film by a method such as etching after forming the metal film.

In one embodiment, a plating film is formed by electroless plating. A practical electroless plating method is not particularly limited. Examples of an adoptable electroless plating method are an electroless plating method using a formalin-based electroless plating bath, and an electroless plating method using hypophosphorous acid having a low deposition rate as a reducing agent. Other practical examples of the electroless plating method are electroless nickel plating, electroless copper plating, and electroless copper-nickel plating. Performing the above-mentioned irradiation step and oxidation step improves the adhesion between the first resin layer and the electroless plating layer deposited by any of these methods.

When the perforations 150 are formed in the first resin layer 100, a plating metal can be deposited even on the side surfaces of the perforations 150 by modifying the side surfaces of the perforations 150 in the above-described way.

In one embodiment, electroless plating can be performed by the following method.

1. The first resin layer 100 is degreased by dipping it in an alkaline solution, thereby increasing the hydrophilicity.

2. The first resin layer 100 is dipped in a solution containing a binder such as a cation polymer which binds the first resin layer 100 and catalyst ions.

3. The first resin layer 100 is dipped in a solution containing the catalyst ions.

4. The first resin layer 100 is dipped in a solution containing a reducing agent, thereby reducing and depositing the catalyst ions.

5. A plating metal is deposited on the deposited catalyst.

In another embodiment, a plating film can be formed by a high-speed electroless plating method. The high-speed electroless plating method can form a thicker plating film.

In still another embodiment, a plating metal is further deposited by electroplating on a plating film formed by electroless plating. This method can form a still thicker plating film. A practical electroplating method is not particularly limited.

The thickness of the electrode pattern 110 formed by plating is not particularly limited. In terms of improvement of the flatness of the obtained electrostatic adsorptive belt 190, the electrode pattern 110 may have a thickness almost equal to the depth of the recess 140 formed in the first resin layer 100. However, when performing smoothing in the smoothing step (to be described later), the thickness of the electrode pattern 110 may differ from the depth of the recess 140 formed in the first resin layer 100.

When the perforations 150 are formed in the first resin layer 100, a plating metal is deposited in the perforations 150, and the perforations 150 are at least partially filled with the deposited metal, thereby forming the power feeders 120, as shown in FIG. 1D. In one embodiment, the perforations 150 are completely filled with the deposited metal. The thus-formed power feeders 120 electrically contact the electrode patterns 110 because the perforations 150 are formed in portions for forming the electrode patterns 110 on the first resin layer 100. According to this embodiment, the metal power feeders 120 extending through the first resin layer 100 can be easily formed by plating.

The material of the electrode pattern 110 is not particularly limited, and an appropriate material can be selected in accordance with the characteristic of the electrostatic adsorptive belt 190 to be obtained.

Smoothing Step

In the smoothing step of step S550, a surface of a laminate formed by the first resin layer 100 and electrode patterns 110, on which the electrode patterns 110 are formed, is smoothed before a lamination step (to be described later) after the plating step. In a practical example, at least one of the first resin layer 100 and electrode pattern 110 is polished so that on a surface of the first resin layer 100 on which the electrode pattern 110 is formed, a surface excluding the recess 140 becomes flush with the surface of the electrode pattern 110. By thus performing smoothing, the electrostatic adsorptive belt 190 obtained by laminating a second resin layer 130 in the lamination step can be made flatter. The electrostatic adsorptive belt 190 is advantageous because of a high medium adsorptive force and stable conveyance. However, it is not essential to perform the smoothing step. Since the electrode pattern 110 is formed in the recess 140 formed in the first resin layer 100, the flatter electrostatic adsorptive belt 190 can be obtained without performing the smoothing step, compared to the related art in which the electrode pattern 110 is formed on a flat base.

When the perforations 150A and 150B are formed and the power feeders 120 are arranged, a surface of the first resin layer 100 on which the power feeders 120 are arranged, that is, a surface of a laminate formed by the first resin layer 100 and power feeders 120, on which the electrode patterns 110 are not formed, may be smoothed. In a practical example, at least one of the first resin layer 100 and power feeder 120 is polished so that a surface opposite to a surface of the first resin layer 100 on which the electrode pattern 110 is formed is flush with the surface of the power feeder 120. By performing smoothing in this manner, the obtained electrostatic adsorptive belt 190 can be made flatter.

Smoothing can be performed by an arbitrary method. For example, at least one of the first resin layer 100, electrode pattern 110, and power feeder 120 can be polished by performing chemical mechanical polishing (CMP).

Lamination Step

In the lamination step of step S560, the second resin layer 130 is formed on a surface of the first resin layer 100 on which the electrode patterns 110 are formed, as shown in FIG. 1E. For example, lamination can be performed by using an arbitrary adhesive, and adhering the second resin layer 130 onto a surface of the first resin layer 100 on which the electrode patterns 110 are formed.

The material and thickness of the second resin layer 130 are not particularly limited. However, in one embodiment, the second resin layer 130 is a surface which contacts a medium conveyed by the electrostatic adsorptive belt 190. In this case, the second resin layer 130 desirably has a proper resistance so as to charge the surface to an extent suitable for conveyance of the medium. The material and thickness of the second resin layer 130 are selected so that the second resin layer 130 has a controlled resistance suitable for conveying a medium by the electrostatic adsorptive belt 190. The second resin layer 130 has volume resistivity of not larger than $10^{15}$ Ω·cm in one embodiment, not larger than $10^{14}$ Ω·cm in another embodiment, and not larger than $10^{13}$ Ω·cm in a further embodiment. The second resin layer also has volume resistivity of not smaller than $10^{9}$ Ω·cm in one embodiment, not smaller than $10^{10}$ Ω·cm in another embodiment, and not smaller than $10^{11}$ Ω·cm in a further embodiment.

After the lamination step, the two ends of the electrostatic adsorptive belt 190 are bonded, thereby fabricating an endless belt.

This embodiment can fabricate the electrostatic adsorptive belt 190 having the fine electrode patterns 110 while implementing reduction of the environmental load without using etching.

Electrostatic Adsorptive Belt

The electrostatic adsorptive belt 190 manufactured by the above-described manufacturing method (to be referred to as the electrostatic adsorptive belt according to this embodiment hereinafter) includes the first resin layer 100, electrode patterns 110, and second resin layer 130, as shown in FIG. 1E. The first resin layer 100 is formed by forming the recesses 140 in the resin layer, in other words, is formed integrally. The electrode patterns 110 are formed in the recesses 140 of the first resin layer 100. Further, the second resin layer 130 is laminated on a surface of the first resin layer 100 on which the electrode patterns 110 are formed.

Figure 6:
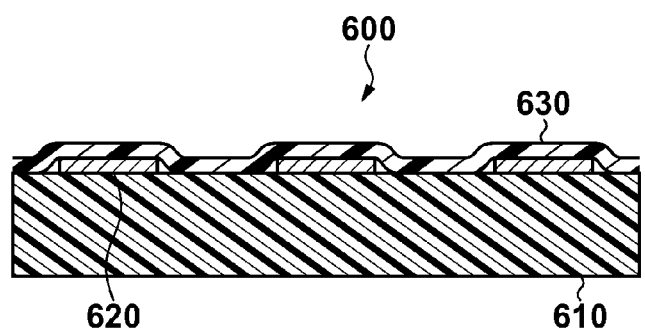
FIG. 6 is a schematic view showing a conventional electrostatic adsorptive belt.

In the electrostatic adsorptive belt 190 according to this embodiment, the electrode patterns 110 are formed in the recesses 140 formed in the first resin layer 100. To the contrary, in a related art in which electrode patterns 620 are formed on a flat base 610 and a resin layer 630 is further laminated, as shown in FIG. 6, the flatness of an electrostatic adsorptive belt 600 decreases owing to the thickness of the electrode pattern 620. The electrostatic adsorptive belt 190 according to this embodiment is therefore advantageous because of higher flatness, a higher medium adsorptive force, and more stable conveyance. Since the first resin layer 100 is formed integrally, it is hardly damaged by a force applied by a method such as bending.

In one embodiment, for example, a surface of a laminate formed by the first resin layer 100 and electrode patterns 110, on which the electrode patterns 110 are formed, is smoothed as a result of performing the above-mentioned smoothing step. This arrangement further improves the flatness of the electrostatic adsorptive belt 190 according to this embodiment.

One embodiment adopts the power feeders 120A and 120B which are connected to the electrode patterns 110 and extend through the first resin layer 100. This arrangement can decrease a step on the electrostatic adsorptive belt 190 because it is unnecessary to cut part of the first resin layer 100 in order to supply electricity to the electrode patterns 110. This can suppress vibrations when the electrostatic adsorptive belt 190 is driven, and implement stable power feeding to the electrode patterns 110 and stable conveyance of a medium.

Conveyance System and Printing Apparatus

A conveyance system and printing apparatus including the electrostatic adsorptive belt 190 according to this embodiment will be explained with reference to FIGS. 3 and 4. The conveyance system is constituted by the electrostatic adsorptive belt 190 and the driving unit of the electrostatic adsorptive belt 190. The printing apparatus is constituted by the electrostatic adsorptive belt 190, the driving unit of the electrostatic adsorptive belt 190, and an image forming unit.

FIG. 3 is a schematic view showing the main arrangement of a printing apparatus 300. The printing apparatus 300 includes the electrostatic adsorptive belt 190, the power feeding brushes 310, an image forming unit 320, and rollers 330. The electrostatic adsorptive belt 190 is an endless belt and is installed so that the second resin layer 130 is located outside. The rollers 330 are an example of the driving unit which drives the electrostatic adsorptive belt 190. The rollers 330 convey a medium 340 adsorbed by the electrostatic adsorptive belt 190.

The medium 340 is adsorbed by the electrostatic adsorptive belt 190, conveyed from a paper feed unit (not shown), and discharged to a discharge unit (not shown). The image forming unit 320 forms an image on the conveyed medium 340. An image forming method by the image forming unit 320 is not particularly limited and can be, for example, an electrophotographic method or inkjet method.

The power feeding brushes 310 are arranged in contact with the inside of the electrostatic adsorptive belt 190. More specifically, the power feeding brushes 310 contact the power feeders 120A and 120B exposed inside the electrostatic adsorptive belt 190, and supply electricity to the electrode patterns 110 via the power feeders 120A and 120B.

The more detailed arrangement of the power feeding brushes 310 will be described with reference to FIG. 4. FIG. 4 is a view showing the positional relationship between the electrode patterns 110, the power feeders 120A and 120B, and the power feeding brushes 310A and 310B at contact portions between the electrostatic adsorptive belt 190 and the power feeding brushes 310 when viewed from the second resin layer 130. The electrostatic adsorptive belt 190 shown in FIG. 4 has the electrode patterns 110 arranged like stripes. More specifically, the electrode patterns 110 are constituted by a plurality of rectangular electrodes each extending in the widthwise direction of the electrostatic adsorptive belt 190. The electrode patterns 110 are constituted by a repetition of rectangular electrodes each having the power feeder 120A at one end of the electrostatic adsorptive belt 190 in the widthwise direction, and rectangular electrodes each having the power feeder 120B at the other end of the electrostatic adsorptive belt 190 in the widthwise direction.

Figure 4:
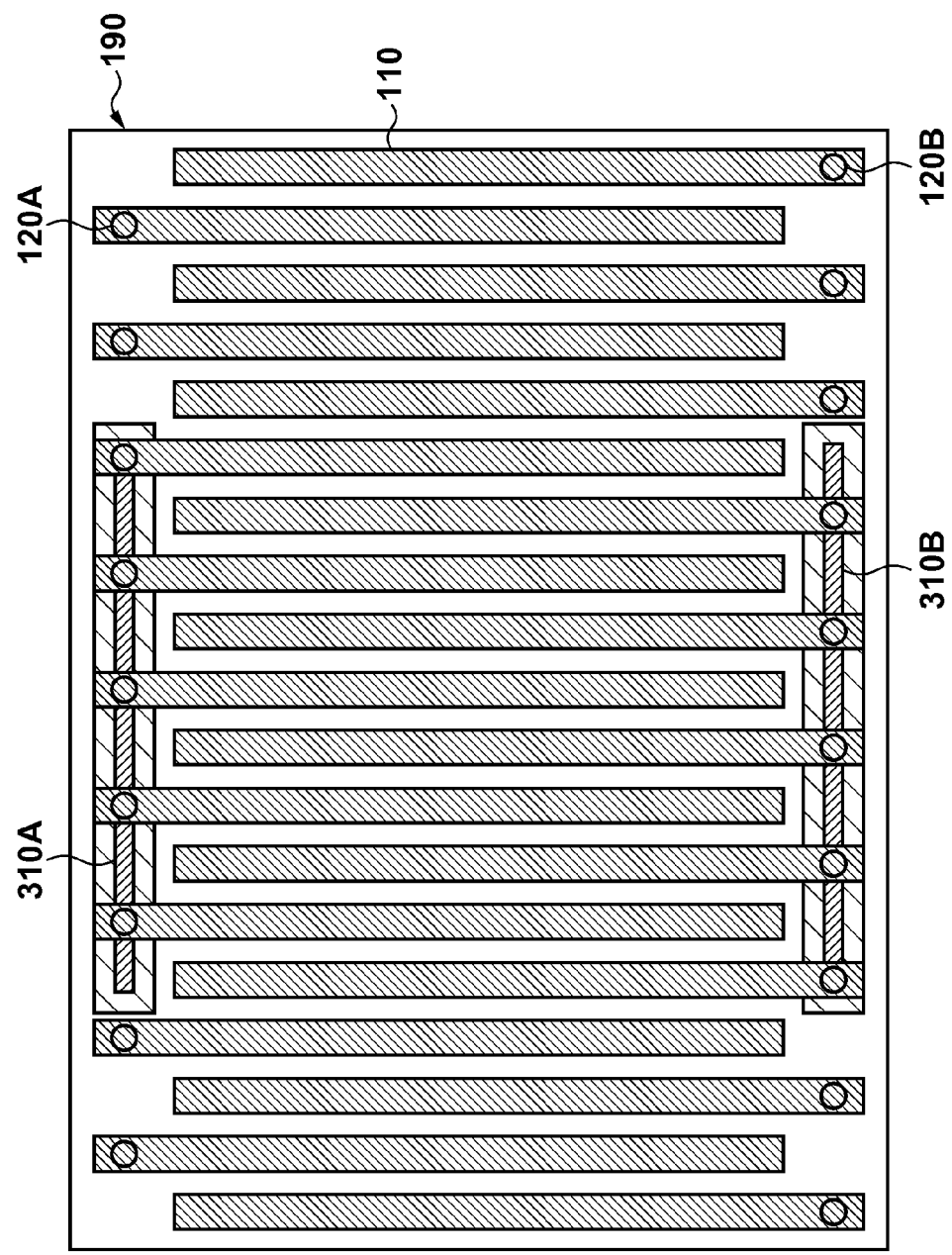
FIG. 4 is a view showing the positional relationship between the electrostatic adsorptive belt and a power feeding brush according to the first embodiment.

As shown in FIG. 4, a pair of power feeding brushes 310A and 310B contact the two ends of the electrostatic adsorptive belt 190 in the widthwise direction, respectively. Since the power feeders 120A and 120B are arranged at the two ends of the electrostatic adsorptive belt 190 in the widthwise direction, the power feeding brushes 310A and 310B contact the power feeders 120A and 120B. In this fashion, electricity is supplied from the power feeding brushes 310 to the electrode patterns 110. However, the arrangement of the power feeding brushes 310 and the arrangement of the power feeders 120A and 120B are not limited to those shown in FIG. 4.

The electrostatic adsorptive belt 190 according to this embodiment can satisfactorily adsorb the medium 340 because of high flatness. Also, when the electrostatic adsorptive belt 190 is driven in contact with the rollers 330, vibrations are hardly generated because of high flatness. The medium 340 can be conveyed stably.

Second Embodiment

Figure 7:
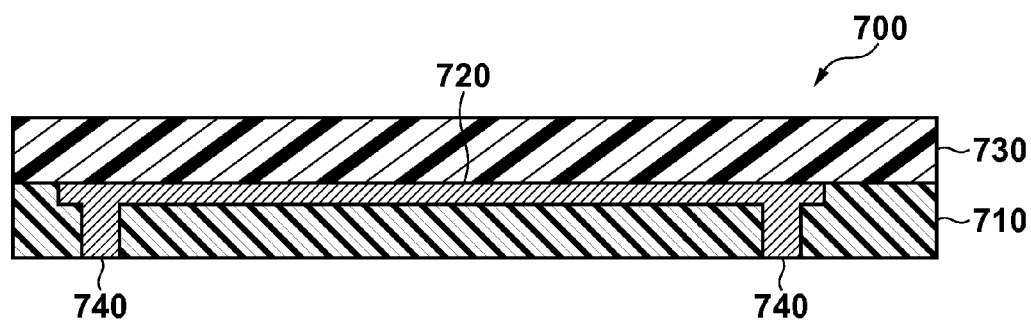
FIG. 7 is a sectional view showing an example of an electrostatic adsorptive belt according to the second embodiment.

FIG. 7 is a sectional view showing an electrostatic adsorptive belt 700 according to the second embodiment in a direction perpendicular to the lengthwise direction. In this specification, the lengthwise direction of the electrostatic adsorptive belt is a direction in which the electrostatic adsorptive belt is driven. The widthwise direction of the electrostatic adsorptive belt is a direction perpendicular to the lengthwise direction along the surface of the electrostatic adsorptive belt. The electrostatic adsorptive belt 700 includes a first resin layer 710, a second resin layer 730, an electrode pattern 720 sandwiched between the first resin layer 710 and the second resin layer 730, and power feeders 740 which are connected to the electrode pattern 720 and extend through the first resin layer 710. A power supply is connected to the electrode pattern 720 via the power feeder 740 to charge the surface of the second resin layer 730, and the electrostatic adsorptive belt 700 adsorbs a medium by the charges.

The shape of the electrostatic adsorptive belt 700 is not particularly limited and can be, for example, an endless belt having a predetermined width.

The first resin layer 710 is the base of the electrostatic adsorptive belt 700. The material of the first resin layer 710 is not particularly limited as long as it is an insulating resin material. Examples of the material of the first resin layer 710 are a cycloolefin polymer, polystyrene, and polyethylene terephthalate. Also, the thickness of the first resin layer 710 is not particularly limited and can be appropriately selected in accordance with the application purpose of the electrostatic adsorptive belt 700.

The electrode pattern 720 is an electrode which is made of a conductive material and has a predetermined pattern. The electrode pattern 720 is sandwiched between the first resin layer 710 and the second resin layer 730. The material of the electrode pattern 720 is not particularly limited and can be a metal material such as nickel or copper. In one embodiment, the electrode pattern 720 is formed in a recess in the surface of the first resin layer 710. In another embodiment, a surface of a laminate formed by the first resin layer 710 and electrode pattern 720 on the side of the electrode pattern 720 is flat. Owing to this arrangement, the second resin layer 730 has a flat surface when the second resin layer 730 is laminated on the first resin layer 710 and electrode pattern 720. The electrostatic adsorptive belt 700 having this flat surface has an advantage in which vibrations are hardly generated at the time of driving. However, it is not essential that the first resin layer 710 has a recess and the electrode pattern 720 is formed in the recess.

The second resin layer 730 constitutes a surface to which a medium conveyed by the electrostatic adsorptive belt 700 is adsorbed. The material of the second resin layer 730 is not particularly limited as long as it is an insulating resin material. Also, the thickness of the second resin layer 730 is not particularly limited. However, the second resin layer 730 desirably has a proper resistance so as to charge the surface to an extent suitable for conveyance of the medium. The material and thickness of the second resin layer 730 are selected so that the second resin layer 730 has a controlled resistance suitable for conveying a medium by the electrostatic adsorptive belt 700. The material of the second resin layer 730 is not particularly limited as long as it is an insulating resin material. The second resin layer 130 has volume resistivity of not larger than $10^{15}$ Ω·cm in one embodiment, not larger than $10^{14}$ Ω·cm in another embodiment, and not larger than $10^{13}$ Ω·cm in a further embodiment. The second resin layer also has volume resistivity of not smaller than $10^9$ Ω·cm in one embodiment, not smaller than $10^{10}$ Ω·cm in another embodiment, and not smaller than $10^{11}$ Ω·cm in a further embodiment. Examples of the material of the second resin layer 730 are a cycloolefin polymer, polystyrene, and polyethylene terephthalate.

The power feeder 740 is made of a conductive material and connected to the electrode pattern 720. The power feeder 740 extends through the first resin layer 710 and is connected to a surface of the first resin layer 710 on which the electrode pattern 720 is not formed. The material of the power feeder 740 is not particularly limited and can be a metal material such as nickel or copper. Also, the shape of the power feeder 740 is not particularly limited, and can be, for example, a columnar or prism shape, or a cylindrical shape not filled with a conductive material at the center. The size of the power feeder 740 is not particularly limited. For example, the diameter of the power feeder 740 on a surface of the first resin layer 710 on which the electrode pattern 720 is not formed can be 100 μm or less. The small power feeder 740 can be fabricated by, for example, a method using an ultraviolet laser beam, as in the first embodiment.

Figure 8:
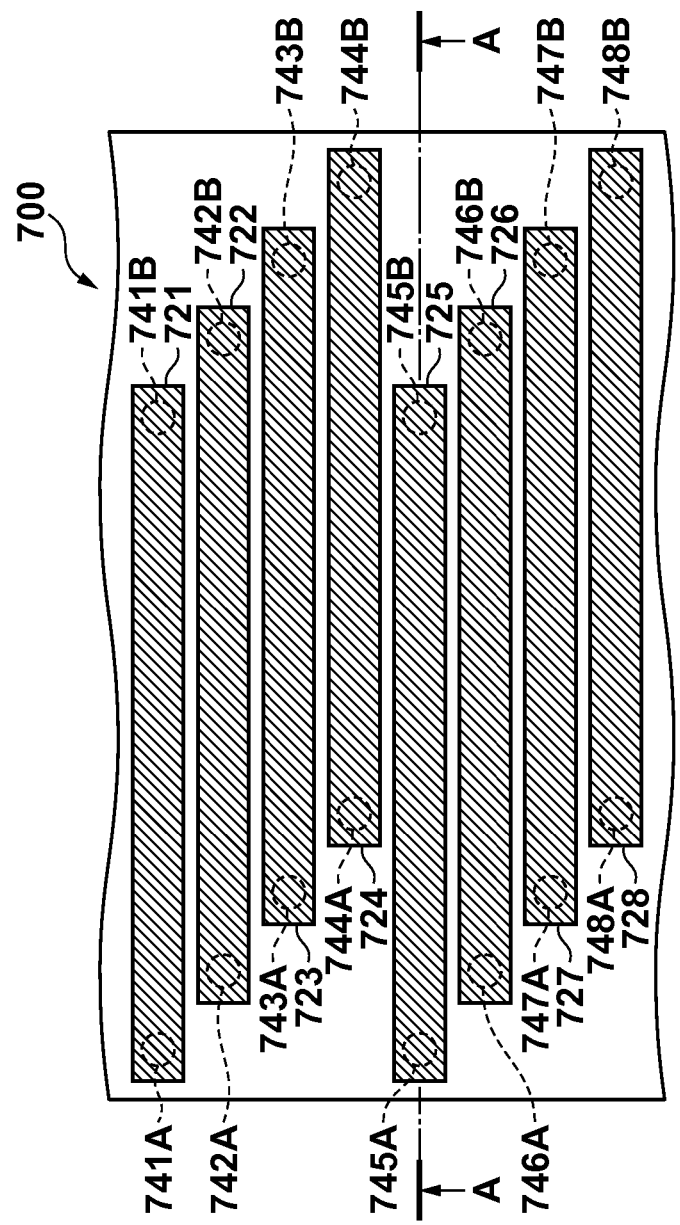
FIG. 8 is a plan view showing an example of the electrostatic adsorptive belt according to the second embodiment.

The electrode pattern 720 includes the first to Nth (N≤3) electrodes. The arrangement of the electrodes will be explained with reference to FIG. 8. FIG. 8 is a plan view showing the electrostatic adsorptive belt 700 when viewed from the second resin layer 730. FIG. 8 shows first to fourth electrodes 721 to 724. That is, FIG. 8 shows a case for N=4. FIG. 8 shows part of the electrostatic adsorptive belt 700. For descriptive convenience, FIG. 8 does not show the second resin layer 730. FIG. 7 is equivalent to a sectional view taken along a line A-A in FIG. 8.

The electrode pattern 720 includes the plurality of electrodes 721 to 724. More specifically, the electrode pattern 720 includes the first electrode 721, second electrode 722, third electrode 723, and fourth electrode 724. The first to fourth electrodes 721 to 724 are insulated from each other on the electrostatic adsorptive belt 700. In one embodiment, the first to fourth electrodes 721 to 724 are arrayed in the lengthwise direction of the electrostatic adsorptive belt 700. In one embodiment, the electrodes 721 to 724 have a rectangular shape. In the example of FIG. 8, the electrodes 721 to 724 have a band shape and extend parallel in the widthwise direction of the electrostatic adsorptive belt 700. The electrodes 721 to 724 extend from one end to the other end of the electrostatic adsorptive belt 700. However, the shape of the electrodes 721 to 724 is not limited to one shown in FIG. 8. For example, the electrodes 721 to 724 may extend from one end to the other end of the electrostatic adsorptive belt 700 obliquely with respect to the widthwise direction of the electrostatic adsorptive belt 700.

The first to Nth electrodes are connected to the first to Nth power feeders, respectively. In the example of FIG. 8, the power feeders 740 include a first power feeder 741A, second power feeder 742A, third power feeder 743A, and fourth power feeder 744A. The first electrode 721 is connected to the first power feeder 741A, the second electrode 722 is connected to the second power feeder 742A, the third electrode 723 is connected to the third power feeder 743A, and the fourth electrode 724 is connected to the fourth power feeder 744A. The positional relationship between the first to fourth electrodes 721 to 724 and the first to fourth power feeders 741A to 744A is not particularly limited. In the example of FIG. 8, the first to fourth power feeders 741A to 744A are arranged at one-end portions on the first to fourth electrodes 721 to 724.

The positions of the first to Nth power feeders are shifted, i.e., different, in the widthwise direction of the electrostatic adsorptive belt 700. Also in the example of FIG. 8, the positions of the first to fourth power feeders 741A to 744A are shifted, i.e., different in the widthwise direction of the electrostatic adsorptive belt 700, that is, in the lateral direction in FIG. 8. In one embodiment of a conveyance system including the electrostatic adsorptive belt 700, when driving the electrostatic adsorptive belt 700 serving as an endless belt, a plurality of voltage application units (for example, power feeding brushes connected to a power supply) are fixed to contact the first to fourth power feeders 741A to 744A, respectively. This arrangement can selectively supply voltages to the first to fourth electrodes 721 to 724 by using the respective fixed voltage application units.

Each of the electrodes 721 to 724 may be connected to a plurality of power feeders. For example, in FIG. 8, the first electrode 721 is connected to the first power feeder 741A and a power feeder 741B at the two ends of the first electrode 721. Similarly, the second to fourth electrodes 722 to 724 are connected to the second to fourth power feeders 742A to 744A, and power feeders 742B to 744B. By connecting one electrode to a plurality of power feeders, a voltage can be stably supplied to the electrode via the plurality of power feeders. In one embodiment, to enable the above-mentioned selective voltage supply, the power feeders 741B to 744B are arranged to be shifted from each other in the widthwise direction of the electrostatic adsorptive belt 700 and shifted from the positions of the first to fourth power feeders 741A to 744A.

In one embodiment, the electrode pattern 720 has a structure in which the first to Nth (N≤3) electrodes are repetitively arrayed in the lengthwise direction of the electrostatic adsorptive belt 700. In the example of FIG. 8, first to fourth electrodes 725 to 728 having the same structure are repetitively arranged in addition to the first to fourth electrodes 721 to 724. Each of a plurality of ith electrodes (1≤i≤N) is connected to the ith power feeder at the same position in the widthwise direction of the electrostatic adsorptive belt 700. In the example of FIG. 8, the first power feeder 741A and a first power feeder 745A are connected to the repetitively arranged first electrodes 721 and 725 at the same positions in the widthwise direction of the electrostatic adsorptive belt 700.

In one embodiment of the conveyance system including the aforementioned electrostatic adsorptive belt 700, the fixed voltage application unit corresponding to the first power feeders comes into contact with the power feeders 741A and 745A when driving the electrostatic adsorptive belt 700. In contrast, the voltage application unit corresponding to the first power feeders does not contact the remaining power feeders 742A to 744A, and power feeders 746A to 748A. Hence, one voltage application unit corresponding to the first power feeders can selectively supply a voltage to the repetitively arranged first electrodes 721 and 725. As will be described later, various media can be stably conveyed by using the electrostatic adsorptive belt 700 having this arrangement.

The repetitively arranged first to fourth electrodes 725 and 728 may include power feeders 745B to 748B, similarly to the first to fourth electrodes 721 to 724.

In one embodiment, the number N is 4 or more and can be an even number. In this case, the medium adsorptive force can be efficiently controlled by controlling voltages to be supplied to the first to Nth electrodes, which will be described later.

The electrodes 721 to 728 may be narrow. Portions in which the electrodes 721 to 728 are arranged, and portions in which the electrodes 721 to 728 are not arranged are different in bendability because the rigidity is different. When the electrostatic adsorptive belt 700 as an endless belt is driven by using rollers arranged inside the endless belt, the electrostatic adsorptive belt 700 bends along the rollers less smoothly as the electrodes 721 to 728 become wider. In this case, vibrations are readily generated when the electrostatic adsorptive belt 700 is driven. As the electrodes 721 to 728 are narrower, the electrostatic adsorptive belt 700 bends along the rollers more smoothly, and vibrations are hardly generated at the time of driving. From this viewpoint, in one embodiment, the width of each of the first to Nth electrodes in the lengthwise direction of the electrostatic adsorptive belt 700 is set to 1.0 mm or less, 0.5 mm or less, 0.2 mm or less, or 0.1 mm or less. The lower limit of the width is not particularly limited and can be, for example, 10 µm or more.

As will be described later, when no voltage is applied to some electrodes, the adsorptive force may vary depending on the position of a medium being conveyed on the electrostatic adsorptive belt 700 if the number of electrodes per unit length is small. Even from this viewpoint, the width of each of the first to Nth electrodes in the lengthwise direction of the electrostatic adsorptive belt 700 may be small.

In one embodiment, as shown in FIG. 8, the electrodes 721 to 728 have the same shape and are arranged to be shifted from each other in the widthwise direction of the electrostatic adsorptive belt 700. In another embodiment, the electrodes 721 to 728 may have different shapes. For example, the first to fourth electrodes 721 to 724 may have rectangular shapes which have different lengths and extend in the widthwise direction of the electrostatic adsorptive belt 700.

In still another embodiment, the first to fourth electrodes 721 to 724 may be arrayed in the widthwise direction of the electrostatic adsorptive belt 700. For example, the first to fourth electrodes 721 to 724 may have a rectangular shape extending in the lengthwise direction of the electrostatic adsorptive belt 700 and be arranged side by side in the widthwise direction of the electrostatic adsorptive belt 700.

Figure 10:
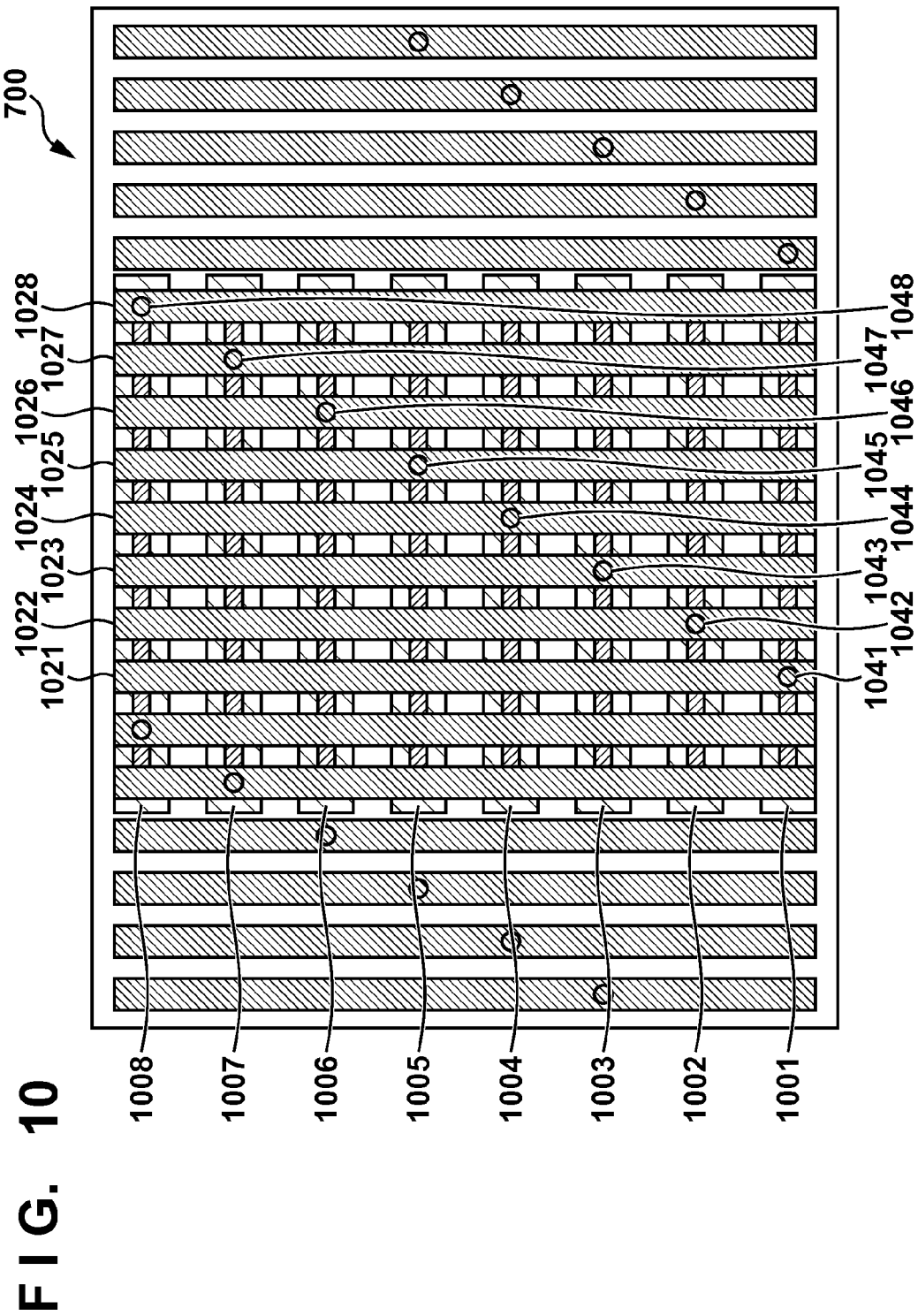
FIG. 10 is a view showing the positional relationship between the electrostatic adsorptive belt and a power feeding brush according to the second embodiment.

The first to fourth electrodes 721 to 724 may have the same shape and be aligned in the lengthwise direction of the electrostatic adsorptive belt 700. In this case, the first to fourth power feeders 741A to 744A are arranged at the ends of the first to fourth electrodes 721 to 724 or portions except for these ends so that the positions of the first to fourth power feeders 741A to 744A are shifted, i.e., different, in the widthwise direction of the electrostatic adsorptive belt 700. FIG. 10 shows a similar embodiment. First to eighth electrodes 1021 to 1028 have the same shape and are aligned in the lengthwise direction of the electrostatic adsorptive belt 700.

Conveyance System and Printing Apparatus

A conveyance system 900 and printing apparatus 950 including the electrostatic adsorptive belt 700 according to the second embodiment will be explained with reference to FIG. 9. The conveyance system 900 includes the electrostatic adsorptive belt 700, a driving unit 910, and a voltage application unit 920.

Figure 9:
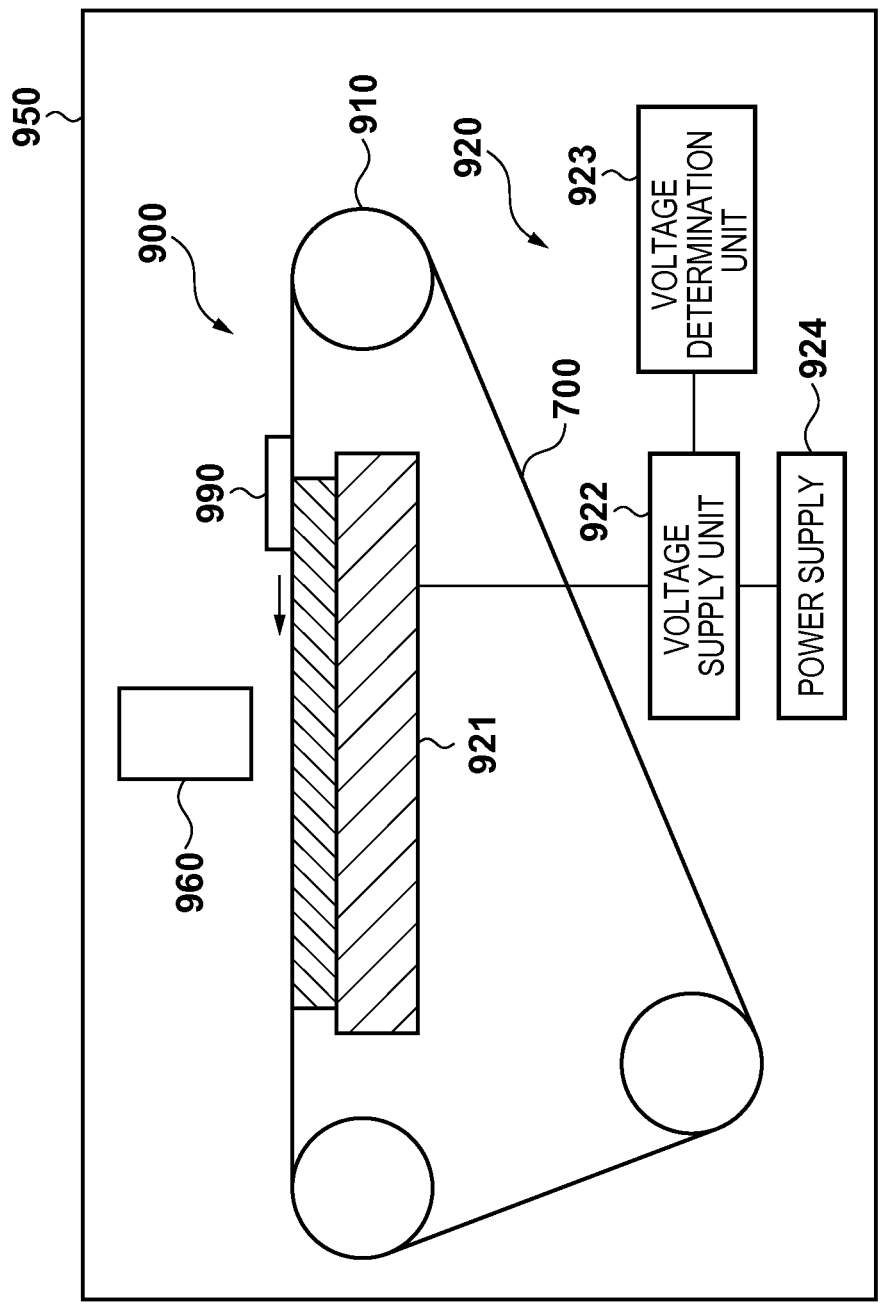
FIG. 9 is a schematic view showing a conveyance system and printing apparatus according to each embodiment.

In the embodiment of FIG. 9, the electrostatic adsorptive belt 700 is an endless belt and is installed so that the second resin layer 730 is located outside. The driving unit 910 drives the electrostatic adsorptive belt 700 to convey a medium 990 adsorbed by the electrostatic adsorptive belt 700. The medium 990 is adsorbed by the electrostatic adsorptive belt 700, conveyed from a paper feed unit (not shown), and discharged to a discharge unit (not shown). In the example of FIG. 9, the driving unit 910 is implemented by rollers, and three rollers are arranged inside the electrostatic adsorptive belt 700. However, the driving unit 910 is not limited to the rollers as long as it can drive the electrostatic adsorptive belt 700. Also, the arrangement of the driving unit 910 is not particularly limited.

The voltage application unit 920 determines voltages to be respectively applied to the first to Nth electrodes 721 to 728 of the electrode pattern 720. The voltage application unit 920 comes into contact with the power feeders 740 of the electrostatic adsorptive belt 700 and supplies the determined voltages to the first to Nth electrodes 721 to 728 via the power feeders 740. The detailed arrangement of the voltage application unit 920 will be described later.

The printing apparatus 950 includes the conveyance system 900 and an image forming unit 960. The image forming unit 960 forms an image on the conveyed medium 990. An image forming method by the image forming unit 960 is not particularly limited and can be, for example, an electrophotographic method or inkjet method.

The voltage application unit 920 will be explained in more detail. The voltage application unit 920 determines voltages to be applied to respective electrodes, and selectively applies the determined voltages to the corresponding electrodes. In one embodiment, the voltage application unit 920 includes a power feeding brush 921, voltage supply unit 922, and voltage determination unit 923. The power feeding brush 921 is connected to the voltage supply unit 922, and arranged in contact with the electrostatic adsorptive belt 700 on the side of the first resin layer 710. More specifically, the power feeding brush 921 contacts the power feeders 740 exposed on the electrostatic adsorptive belt 700 on the side of the first resin layer 710, and supplies electricity to the electrode pattern 720 via the power feeders 740.

The more detailed arrangement of the power feeding brush 921 will be described with reference to FIG. 10. FIG. 10 is a view showing the positional relationship between the electrode pattern 720, the power feeder 740, and the power feeding brush 921 at the contact portion between the electrostatic adsorptive belt 700 and the power feeding brush 921 when viewed from the second resin layer 730. In FIG. 10, the first resin layer 710 and second resin layer 730 are not illustrated for descriptive convenience.

The electrostatic adsorptive belt 700 shown in FIG. 10 includes the first to eighth electrodes 1021 to 1028 having the same shape. The first to eighth electrodes 1021 to 1028 have an elongated rectangular shape extending in the widthwise direction of the electrostatic adsorptive belt 700, and are aligned in the lengthwise direction of the electrostatic adsorptive belt 700. First to eighth power feeders 1041 to 1048 are connected to the first to eighth electrodes 1021 to 1028, respectively. The first to eighth power feeders 1041 to 1048 are arranged to be shifted from each other in the widthwise direction of the electrostatic adsorptive belt 700.

In the example of FIG. 10, the power feeding brush 921 is constituted by first to eighth power feeding brushes 1001 to 1008. The first to eighth power feeding brushes 1001 to 1008 are arranged to be shifted from each other in the widthwise direction of the electrostatic adsorptive belt 700, and contact the corresponding first to eighth power feeders 1041 to 1048. With this arrangement, the first to eighth power feeding brushes 1001 to 1008 selectively apply voltages supplied from the voltage supply unit 922 to the first to eighth electrodes 1021 to 1028 via the corresponding first to eighth power feeders 1041 to 1048.

Even when the arrangement of the electrodes of the electrostatic adsorptive belt 700 is different, the power feeding brushes arranged to be shifted from each other in the widthwise direction of the electrostatic adsorptive belt 700 can selectively apply voltages to the corresponding electrodes via the power feeders arranged to be shifted from each other in the widthwise direction of the electrostatic adsorptive belt 700.

The voltage supply unit 922 is connected to a power supply 924 and supplies, to the first to eighth power feeding brushes 1001 to 1008, voltages determined by the voltage determination unit 923 respectively for the first to eighth electrodes

1021 to 1028. The voltage determination unit 923 determines voltages to be respectively supplied to the first to eighth electrodes 1021 to 1028.

The voltage determination method by the voltage determination unit 923 will be explained in detail below. FIG. 11 shows the relationship between a combination pattern of voltages to be applied to the first to eighth electrodes 1021 to 1028, and the adsorptive forces of paper A to paper C by the electrostatic adsorptive belt 700. Paper A to paper C are different. In FIG. 11, ○ indicates that the paper adsorptive force is satisfactory, Δ indicates that the paper adsorptive force is medium, and x indicates that the paper adsorptive force is unsatisfactory. Also, + represents that a voltage of +1 kV was applied to a corresponding electrode, − represents that a voltage of −1 kV was applied to a corresponding electrode, and N represents that no voltage was applied to a corresponding electrode.

When voltages were applied according to a pattern a, the adsorptive force of paper A was satisfactory, the adsorptive force of paper B was medium, but the adsorption of paper C was unsatisfactory. That is, when voltages were applied according to the pattern a, a large current flowed during conveyance of paper C. To the contrary, when voltages were applied so that the distance between a positive-voltage-applied electrode and a negative-voltage-applied electrode became longer than that in the pattern a, the adsorptive force of paper C was satisfactory, but the adsorptive force of paper A was poor. In this manner, the resistance, weight, or the like of paper changes depending on the thickness, material, or the like. If voltages are applied according to a predetermined pattern as in a conventional electrostatic adsorptive belt, a problem may arise in conveyance of a specific medium. In this embodiment, voltages to be applied are determined for the respective electrodes. By selectively applying the determined voltages to the corresponding electrodes, various media can be conveyed stably.

In one embodiment, the voltage determination unit 923 holds in advance information representing combination patterns of voltages to be applied to the first to eighth electrodes 1021 to 1028, as shown in FIG. 11. Suitable medium types are associated in advance with the respective combination patterns. The voltage determination unit 923 acquires information representing the type of medium 990 to be conveyed by the electrostatic adsorptive belt 700. For example, the voltage determination unit 923 can acquire information which has been input by the user and represents the type of medium 990. Alternatively, the voltage determination unit 923 may acquire information representing the type of medium 990 from a measurement unit (not shown) which acquires information representing the type of medium 990 by measuring the resistance, weight, or the like of the medium 990. The voltage determination unit 923 controls the voltage supply unit 922 to supply voltages complying with a voltage combination pattern corresponding to the type of medium 990.

However, it is not essential to hold in advance information representing a voltage combination pattern in the voltage determination unit 923. For example, the voltage determination unit 923 may determine voltages to be applied to respective electrodes in accordance with an algorithm determined by experiment based on information such as the resistance, weight, or the like of the medium 990.

The voltage determination unit 923 may be constituted by dedicated hardware or implemented by a computer. For example, the function of the voltage determination unit 923 can be implemented by using a computer including a processor and memory. More specifically, the computer loads a program into the memory from a storage medium recording the program including instructions to cause the computer to perform the above-described process. The processor operates in accordance with this program and can implement the function of the voltage determination unit 923.

The conveyance system 900 and printing apparatus 950 including the electrostatic adsorptive belt 700 have been described. The above-described electrostatic adsorptive belt 700 has an arrangement such that a determined voltage can be applied to selected electrode. However, it is not essential that the conveyance system 900 and printing apparatus 950 include the electrostatic adsorptive belt 700 as described above. That is, the conveyance system 900 and printing apparatus 950 can use an electrostatic adsorptive belt including the first to Nth (N≤3) electrodes insulated from each other on the electrostatic adsorptive belt. For example, the conveyance system 900 and printing apparatus 950 can also use an electrostatic adsorptive belt in which the positions of the first to Nth power feeders are aligned in the lengthwise direction of the electrostatic adsorptive belt. In this case, determined voltages can be selectively supplied to the first to Nth power feeders by using power feeding brushes which move in accordance with the motion of the electrostatic adsorptive belt.

Third Embodiment

Figure 12A:
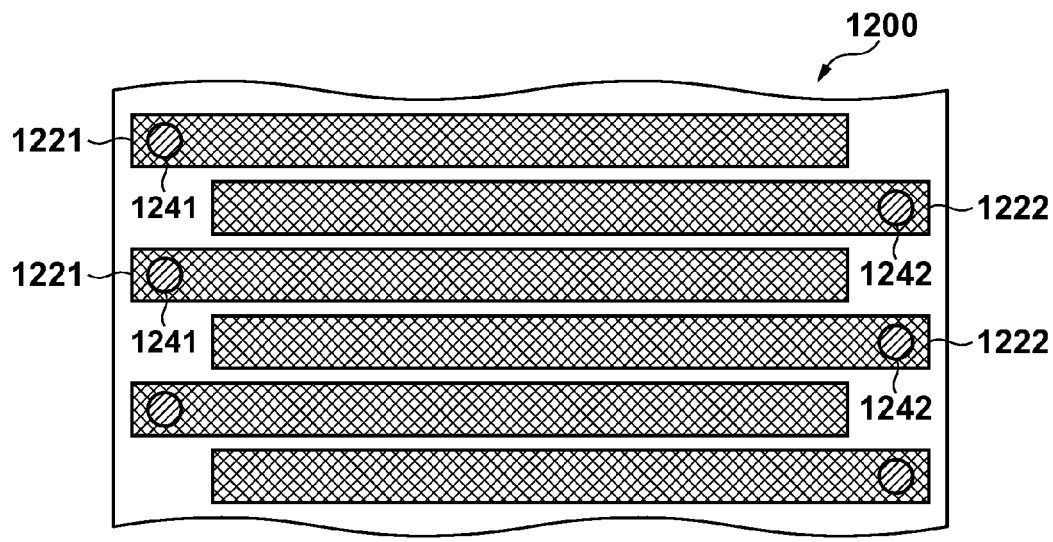
FIGS. 12A to 12B are plan views showing an example of an electrostatic adsorptive belt according to the third embodiment.
Figure 12B:
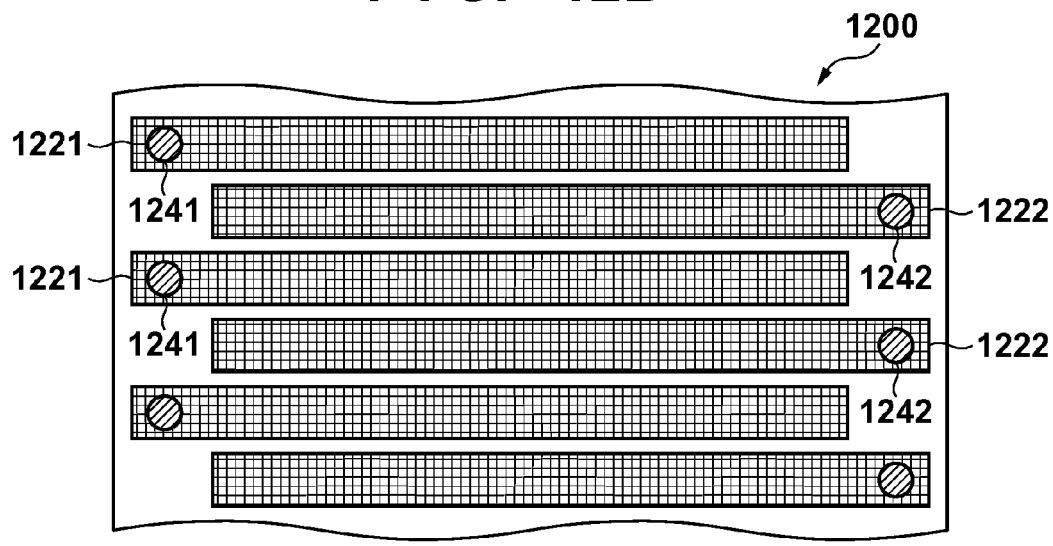

FIG. 12A is a plan view showing an example of an electrostatic adsorptive belt 1200 according to the third embodiment. The electrostatic adsorptive belt 1200 has the same laminated structure as that of the electrostatic adsorptive belt 700 according to the second embodiment. That is, the electrostatic adsorptive belt 1200 includes a first resin layer, a second resin layer, an electrode pattern sandwiched between the first resin layer and the second resin layer, and a power feeder which is connected to the electrode pattern and extends through the first resin layer. These building components are the same as those in the second embodiment unless otherwise specified. FIGS. 12A and 12B show part of the electrostatic adsorptive belt 1200. For descriptive convenience, a second resin layer 730 is not illustrated in FIGS. 12A and 12B.

The electrostatic adsorptive belt 1200 shown in FIG. 12A has an electrode pattern including a plurality of electrodes. More specifically, first electrodes 1221 and second electrodes 1222 are repetitively arranged in the lengthwise direction of the electrostatic adsorptive belt 1200. The first electrodes 1221 and second electrodes 1222 have a band shape and extend parallel in the widthwise direction of the electrostatic adsorptive belt 1200. The first electrodes 1221 are connected at one-end portions to first power feeders 1241, and the second electrodes 1222 are connected at one-end portions to second power feeders 1242. The first power feeders 1241 and second power feeders 1242 are arranged to be shifted from each other in the widthwise direction of the electrostatic adsorptive belt 1200, and can selectively supply voltages by using first and second electrostatic brushes (not shown) arranged fixedly. However, the number and shape of electrodes are not limited to those shown in FIG. 12A.

The inside of each of the first electrodes 1221 and second electrodes 1222 is partially hollowed. For example, the first electrodes 1221 and second electrodes 1222 shown in FIG. 12A have a mesh structure. More specifically, the first electrodes 1221 and second electrodes 1222 are constituted by a plurality of thin lines inclined with respect to the widthwise and lengthwise directions of the electrostatic adsorptive belt 1200.

As described above, a conventional electrostatic adsorptive belt is different in rigidity and thus different in bending between a portion in which an electrode is arranged, and a portion in which no electrode is arranged. Vibrations are readily generated when the electrostatic adsorptive belt is driven. By hollowing part of the inside of the electrode, as in this embodiment, the electrostatic adsorptive belt 1200 easily bends smoothly along rollers. Thus, vibrations are hardly generated at the time of driving, and various media can be conveyed stably.

A method of hollowing the electrode is not particularly limited. A large hollow portion may be formed, or many small hollow portions may be formed. However, when forming electrodes, it is unnecessary to hollow the inside after forming a large electrode surface. For example, electrodes may be selectively formed in the second region so that the first region where no electrode is formed is surrounded by the second region where electrodes are formed. Even by this method, internally hollowed electrodes can be formed.

In one embodiment in which the electrode has a mesh structure, the line width of the mesh can be small in terms of suppression of vibrations at the time of driving. For example, the line width of the mesh may be 300 µm or less, 100 µm or less, or 50 µm or less. The lower limit of the line width is not particularly limited and can be, for example, 10 µm or more. The interval of the mesh, that is, the interval between two adjacent thin lines parallel to each other is not particularly limited and can be, for example, about 50 µm.

FIG. 12B is a plan view showing another example of the electrostatic adsorptive belt 1200 according to the third embodiment. The electrostatic adsorptive belt 1200 shown in FIG. 12B is the same as the electrostatic adsorptive belt 1200 shown in FIG. 12A except that the first electrodes 1221 and second electrodes 1222 are constituted by a plurality of thin lines parallel in the widthwise direction of the electrostatic adsorptive belt 1200 and a plurality of thin lines parallel in the lengthwise direction.

As in the second embodiment, a conveyance system 900 and printing apparatus 950 including the electrostatic adsorptive belt 1200 according to the third embodiment can also be manufactured. In this embodiment, however, it is unnecessary that a voltage application unit 920 determines voltages to be applied to the respective electrodes. For example, the voltage application unit 920 suffices to selectively apply predetermined voltages to corresponding electrodes 1321 and 1322.

Modification

In a modification of the third embodiment, the first electrodes 1221 and second electrodes 1222 of the electrostatic adsorptive belt 1200 are constituted by thin lines having a width of 1.0 mm or less. Even with this arrangement, the electrostatic adsorptive belt 1200 easily bends smoothly along rollers, and vibrations are hardly generated at the time of driving. In terms of suppression of vibrations, the width of the thin line may be 500 µm or less, 300 µm or less, or 100 µm or less. The lower limit of the line width is not particularly limited and can be, for example, 10 µm or more. The shape and arrangement of the thin lines are not particularly limited, and the thin lines may be straight or meander. In one embodiment, the first electrodes 1221 and second electrodes 1222 are thin lines parallel in the widthwise direction of the electrostatic adsorptive belt 1200.

Fourth Embodiment

Figure 13:
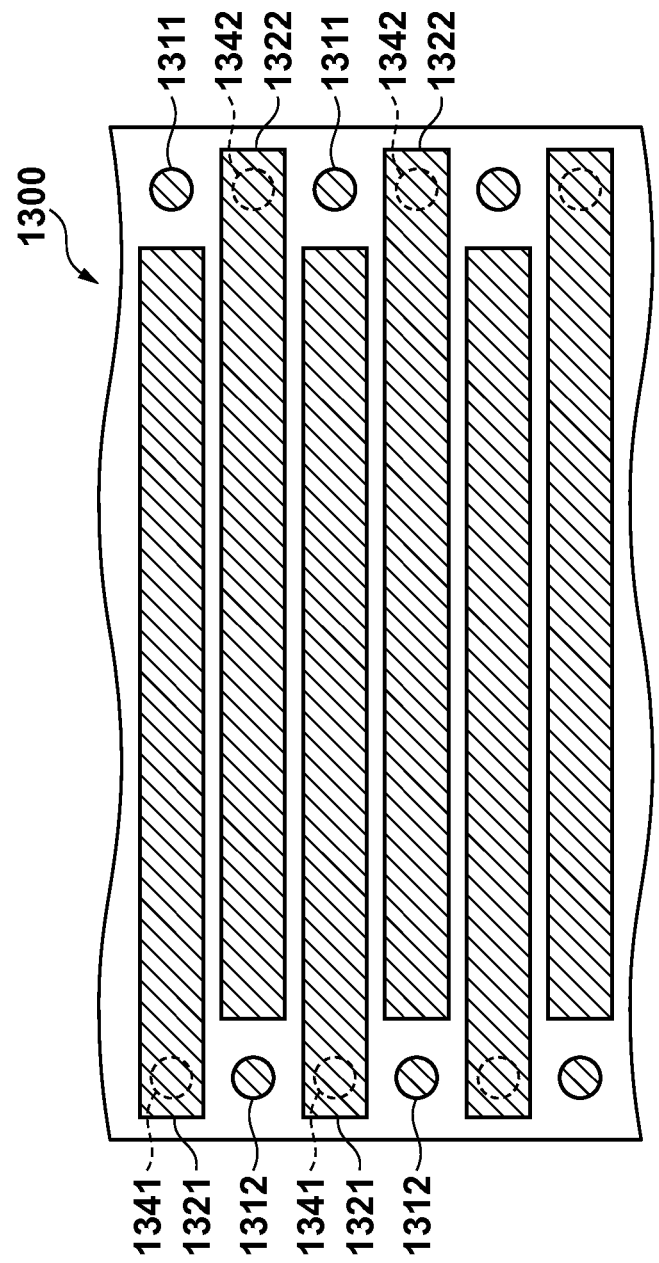
FIG. 13 is a plan view showing an example of an electrostatic adsorptive belt according to the fourth embodiment.

FIG. 13 is a plan view showing an example of an electrostatic adsorptive belt 1300 according to the fourth embodiment. The electrostatic adsorptive belt 1300 has the same laminated structure as that of the electrostatic adsorptive belt 700 according to the second embodiment. That is, the electrostatic adsorptive belt 1300 includes a first resin layer, a second resin layer, an electrode pattern sandwiched between the first resin layer and the second resin layer, and a power feeder which is connected to the electrode pattern and extends through the first resin layer. These building components are the same as those in the second embodiment unless otherwise specified. FIG. 13 shows part of the electrostatic adsorptive belt 1300. For descriptive convenience, a second resin layer 730 is not illustrated in FIG. 13.

The electrostatic adsorptive belt 1300 shown in FIG. 13 has an electrode pattern including a plurality of electrodes. More specifically, first electrodes 1321 and second electrodes 1322 are repetitively arranged in the lengthwise direction of the electrostatic adsorptive belt 1300. The first electrodes 1321 and second electrodes 1322 have a band shape and extend parallel in the widthwise direction of the electrostatic adsorptive belt 1300. The positions of the first electrode 1321 and second electrode 1322 adjacent to each other in the lengthwise direction of the electrostatic adsorptive belt 1300 are shifted from each other in the widthwise direction of the electrostatic adsorptive belt 1300. Further, the first electrodes 1321 are connected at one-end portions to first power feeders 1341, and the second electrodes 1322 are connected at one-end portions to second power feeders 1342. The first power feeders 1341 and second power feeders 1342 are arranged to be shifted from each other in the widthwise direction of the electrostatic adsorptive belt 1300, and can selectively supply voltages by using first and second electrostatic brushes (not shown) arranged fixedly. However, the number and shape of electrodes are not limited to those shown in FIG. 13.

The electrostatic adsorptive belt 1300 further includes a plurality of conductive films. More specifically, first conductive films 1311 and second conductive films 1312 are repetitively arranged in the lengthwise direction of the electrostatic adsorptive belt 1300. The first and second conductive films 1311 and 1312 are arranged in recesses formed in the same surface as that of the first and second electrodes 1321 and 1322, for example, the same surface as that of the first resin layer. The conductive films 1311 and 1312 are arranged in portions of the electrostatic adsorptive belt 1300 in which neither the electrode 1321 nor 1322 is arranged. The first electrodes 1321, second electrodes 1322, first conductive films 1311, and second conductive films 1312 are insulated from each other on the electrostatic adsorptive belt 1300.

More specifically, the first conductive film 1311 is adjacent to the first electrode 1321 in the widthwise direction of the electrostatic adsorptive belt 1300, and adjacent to the second electrode 1322 in the lengthwise direction of the electrostatic adsorptive belt 1300. The second conductive film 1312 is adjacent to the second electrode 1322 in the widthwise direction of the electrostatic adsorptive belt 1300, and adjacent to the first electrode 1321 in the lengthwise direction of the electrostatic adsorptive belt 1300. In the example of FIG. 13, the first and second conductive films 1311 and 1312 have a circular shape. In another embodiment, the first and second conductive films 1311 and 1312 may have a rectangular shape.

The conductive films 1311 and 1312 are made of the same material as that of the electrodes 1321 and 1322. In one embodiment, the conductive films 1311 and 1312 have the same thickness as that of the electrodes 1321 and 1322. The electrostatic adsorptive belt 1300 has uniform rigidity as a whole in comparison with a case in which the conductive films 1311 and 1312 do not exist. The electrostatic adsorptive belt 1300 therefore has advantages in which vibrations are hardly generated at the time of driving, and various media can be conveyed stably.

Although the material of the first and second conductive films 1311 and 1312 is not particularly limited, the same material as that exemplified as the material of the first and second electrodes 1321 and 1322 in the description of the second embodiment is usable. The first and second conductive films 1311 and 1312 can be formed by the same method as that of the first and second electrodes 1321 and 1322. In an embodiment, the first and second conductive films 1311 and 1312 are formed by plating using a method to be described later at the same time as the first and second electrodes 1321 and 1322.

As in the second embodiment, a conveyance system 900 and printing apparatus 950 including the electrostatic adsorptive belt 1300 according to the fourth embodiment can also be manufactured.

Method of Manufacturing Electrostatic Adsorptive Belt According to Each of Second to Fourth Embodiments A method of manufacturing an electrostatic adsorptive belt according to each of the second to fourth embodiments is not particularly limited. However, the electrostatic adsorptive belt according to each of the second to fourth embodiments has a relatively fine electrode pattern. It is sometimes difficult to manufacture the electrostatic adsorptive belt by a method of arranging electrodes and an insulating layer side by side and then laminating them, as in the method described in Japanese Patent Laid-Open No. 2002-218776. In contrast, the method of manufacturing the electrostatic adsorptive belt according to the first embodiment is usable for manufacturing the electrostatic adsorptive belt according to each of the second to fourth embodiments. That is, the electrostatic adsorptive belt according to each embodiment can be manufactured by emitting an ultraviolet laser beam in accordance with a desired electrode pattern in the irradiation step. The electrostatic adsorptive belt manufacturing method according to the first embodiment can be used for forming a band- or thin line-like electrode having a small width, for example, a width of 1.0 mm or less.

EXAMPLES

XPS Measurement

In the following explanation, the oxygen atom amount supplied to the surface of a resin product was measured by XPS analysis. The measured oxygen atom amount indicates the degree of progress of surface modification. Theta Probe manufactured by Thermo Fisher Scientific was used as an XPS analyzer. As an excitation X-ray, a monochromatic X-ray using Al as a target (Al Kα 1486.6 eV) was used. In the measurement, an electron beam and argon ions were emitted in order to neutralize electrification. Table 1 shows the analysis conditions.

TABLE 1

|  | X-ray Beam Diameter (μm) | Step Energy (eV) | Pass Energy (eV) |
| --- | --- | --- | --- |
| Qualitative Analysis | 300 | 1 | 200 |
| Composition Analysis | 300 | 0.1 | 100 |

Modification by Ultraviolet Lamp

Table 2 shows the results of analysis of an electroless plating metal deposition status and a surface modification status obtained by XPS (X-ray Photoelectron Spectroscopy) measurement when a resin product was irradiated with ultraviolet light by using a low-pressure mercury lamp as an ultraviolet light source. More specifically, a cycloolefin polymer material (Zeonor Film ZF-16 manufactured by ZEON, film thickness=100 μm, and surface roughness=1.01 nm) was irradiated with ultraviolet light from the low-pressure mercury lamp for a predetermined time, and XPS measurement was performed. As the low-pressure mercury lamp, the same lamp as used in Experiment 1 (to be described later) was used. The output of the low-pressure mercury lamp was 1.35 mW/cm$^2$ at a wavelength of 185 nm. In addition, electroless plating was performed on the irradiated resin product in the same manner as in a plating step of Experiment 1 (to be described later).

In "Electroless Plating Metal Deposition Status" in Table 2, ○ indicates that a plating metal was deposited, x indicates that no plating metal was deposited, and Δ indicates that a plating metal was partially deposited. Also, "Oxygen Atom Existence Ratio" indicates the ratio (at %) of oxygen atoms to all atoms measured by XPS measurement. "Oxygen Atoms (%) of C—O Bond" indicates the ratio (at %) of oxygen atoms forming a C—O bond to all atoms measured by XPS measurement. "Oxygen Atoms (%) of C=O Bond" indicates the ratio (at %) of oxygen atoms forming a C=O bond to all atoms measured by XPS measurement. In this case, "Oxygen Atom Existence Ratio"="Oxygen Atoms (%) of C—O Bond"+"Oxygen Atoms (%) of C=O Bond".

TABLE 2

| | 0 min | 1 min | 2 min | 3 min | 4 min | 12 min |
| --- | --- | --- | --- | --- | --- | --- |
| Irradiation Time of Low-Pressure Mercury Lamp | | | | | | |
| Cumulative Irradiation Amount (185 nm, 1.35 mW/cm$^2$) | 0 mJ/cm$^2$ | 81 mJ/cm$^2$ | 162 mJ/cm$^2$ | 243 mJ/cm$^2$ | 324 mJ/cm$^2$ | 972 mJ/cm$^3$ |
| Plating Metal Deposition Status | x | x | x | x | x | ○ |
| Oxygen Atom Existence Ratio (%) | 0.0 | 12.6 | — | — | 13.6 | 23.2 |
| Oxygen Atoms in C—O Bond (%) | 0.0 | 8.2 | — | — | 7.8 | 10.0 |
| Oxygen Atoms in C=O Bond (%) | 0.0 | 4.4 | — | — | 5.8 | 13.2 |

As shown in Table 2, an electroless plating metal was not deposited when the cumulative irradiation amount was 324 mJ/cm² or less, and was deposited when the cumulative irradiation amount was 972 mJ/cm² or more. Also, the XPS measurement results demonstrate that the electroless plating metal was not deposited when the oxygen atom existence ratio on the surface of the resin product was 13.6% or less, and was deposited when this ratio was 23.2% or more. Furthermore, an irradiation time of about 10 min was necessary.

Modification by Laser Beam

Table 3 shows the results of analysis of an electroless plating metal deposition status and a surface modification status obtained by XPS measurement when a resin product was irradiated with an ArF excimer laser beam. More specifically, a cycloolefin polymer material (Zeonor Film ZF-16 manufactured by ZEON, film thickness=100 μm, and surface roughness=1.01 nm) was irradiated with a predetermined number of pulses of the ArF excimer laser beam (main wavelength=193 nm) at an energy density of 1,000 mJ/cm² per pulse, and XPS measurement was performed. As the ArF excimer laser, the same laser as used in Experiment 1 (to be described later) was used. Items shown in Table 3 are the same as those shown in Table 2. In addition, electroless plating was performed on the irradiated resin product in the same manner as in the plating step of Experiment 1 (to be described later).

TABLE 3

| Number of Pulses | 0 | 2 | 10 | 20 |
|---|---|---|---|---|
| Plating Metal Deposition Status | x | x | x | x |
| Oxygen Atom Existence Ratio (%) | 0 | 3.8 | — | 4.1 |
| Oxygen Atoms in C—O Bond (%) | 0 | 2.6 | — | 2.5 |
| Oxygen Atoms in C=O Bond (%) | 0 | 1.2 | — | 1.6 |

As shown in Table 3, the oxygen atom existence ratio was almost constant at about 4% even when the number of pulses was changed, that is, the number of pulses and the surface modification amount were not proportional. Also, no electroless plating metal was deposited under any conditions. This was so probably because the surface modified with the laser beam was ablated, that is, the modified portion was removed.

Table 4 shows the results of analysis of an electroless plating metal deposition status and a surface modification status obtained by XPS measurement when the energy density per pulse of the ArF excimer laser beam was 100 mJ/cm². The rest of the conditions were the same as in Table 3.

TABLE 4

| Number of Pulses | 0 | 20 | 100 | 200 |
|---|---|---|---|---|
| Plating Metal Deposition Status | x | x | x | x |
| Oxygen Atom Existence Ratio (%) | 0 | 7.3 | — | 8.7 |
| Oxygen Atoms in C—O Bond (%) | 0 | 4.5 | — | 5.8 |
| Oxygen Atoms in C=O Bond (%) | 0 | 2.8 | — | 2.9 |

As shown in Table 4, the oxygen atom existence ratio was almost constant at about 8% even when the number of pulses was changed, that is, the number of pulses and the surface modification amount were not proportional. Also, no electroless plating metal was deposited under any conditions. However, the oxygen existence amount increased from that when the energy density per pulse was 1,000 mJ/cm². This was so perhaps because the modified surface was hardly removed by ablation when the energy density of the laser beam was low.

Formation of Recess by Laser Beam Irradiation

A cycloolefin polymer material (Zeonor Film ZF-16 manufactured by ZEON, film thickness=100 μm, and surface roughness=1.01 nm) was irradiated with an ArF excimer laser beam (main wavelength=193 nm) at an energy density of 100 mJ/cm² or 1,000 mJ/cm² per pulse. As the ArF excimer laser, the same laser as used in Experiment 1 (to be described later) was used. After that, the depth of a recess formed in the laser beam-irradiated portion was measured by using a stylus step profiler (Alpha-Step manufactured by Yamoto Scientific). The measurement was performed near the central portion (the second measurement) and near the two end portions (the first and third measurements) in the laser beam incidence range. Table 5 shows the measurement results.

TABLE 5

| Number of Pulses | Cumulative Irradiation Amount | 1st Measurement | 2nd Measurement | 3rd Measurement |
|---|---|---|---|---|
| Energy Density Per Pulse: 100 mJ/cm² | | | | |
| 20 pulses | 2000 mJ/cm² | Immeasurable (No Irradiation Mark Was Found) | | |
| 100 pulses | 10000 mJ/cm² | 1517 Å | 3547 Å | 1723 Å |
| 200 pulses | 20000 mJ/cm² | 1427 Å | 1708 Å | 2859 Å |
| Energy Density Per Pulse: 1000 mJ/cm² | | | | |
| 2 pulses | 2000 mJ/cm² | 1801 Å | 3009 Å | 1754 Å |
| 10 pulses | 10000 mJ/cm² | 11221 Å | 11604 Å | 9411 Å |
| 20 pluses | 20000 mJ/cm² | 24802 Å | 20615 Å | 22704 Å |

As shown in Table 5, when the laser beam energy density was higher, a deeper recess was formed. Also, the cumulative irradiation amount and depth were almost proportional when the laser beam energy density was 1,000 mJ/cm². However, when the laser beam energy density was 100 mJ/cm², the depth did not largely change even when the cumulative irradiation amount was increased. This was so presumably because the physical properties changed when the material surface was modified, and the ablation effect decreased especially when the energy density was low.

As described above, a recess was formed in the surface of the resin product by laser beam irradiation. Also, it was possible to control the depth of the recess by controlling the energy density and irradiation amount of the laser beam.

Experiment 1

Substrate Processing

In Experiment 1, a cycloolefin polymer material (Zeonor Film ZF-16 manufactured by ZEON, film thickness=100 μm, and surface roughness=1.01 nm) as a resin material was used as a substrate for electroless plating.

First, the following processes were performed to clean the substrate surface before surface modification was performed.
1. Ultrasonic cleaning with pure water at 50° C. for 3 min
2. Dipping in an alkaline cleaning solution (containing 3.7% of sodium hydroxide) at 50° C. for 3 min
3. Ultrasonic cleaning with pure water at 50° C. for 3 min
4. Drying Irradiation Step Then, an irradiation step of irradiating a desired portion of the substrate with an ultraviolet laser beam was performed. Details of the ultraviolet laser used in Experiment 1 were as follows.
Ultraviolet laser beam:
  ArF excimer laser beam (main wavelength=193 nm) Ultraviolet laser beam irradiation apparatus:
  LPXpro 305 manufactured by COHERENT
Irradiation conditions:
  frequency=50 Hz, pulse width=25 ns, 200 pulses
Irradiation surface energy density per pulse:
  100 mJ/cm$^2$ The oxygen atom existence ratio on the substrate irradiated with the ultraviolet laser beam was measured by XPS measurement and found to be 8.8%. The XPS measurement apparatus cannot measure a hydrogen atom. Thus, the atom existence ratio on the cycloolefin polymer material surface in Experiment 1 was calculated based on only carbon atoms and oxygen atoms.

After the cycloolefin polymer material was irradiated with 200 pulses of the ArF excimer laser beam, the shape of the substrate surface was confirmed by using an SEM (Scanning Electron Microscope). Recesses were formed in the laser beam-irradiated portions, and the depth of the recesses was about 0.2 μm. Also, it was possible to adjust the depth by increasing or decreasing the number of laser beam pulses.

Oxidation Step

Subsequently, an oxidation step of irradiating, by an ultraviolet lamp, the desired portion of the substrate after laser beam irradiation was performed. Details of the ultraviolet lamp (low-pressure mercury lamp) used in Experiment 1 were as follows.
Low-pressure mercury lamp:
  UV-300 (main wavelength=185 nm, 254 nm)
  manufactured by SAMCO
Illumination at irradiation distance of 3.5 cm:
  5.40 mW/cm$^2$ (254 nm)
  1.35 mW/cm$^2$ (185 nm)

More specifically, the substrate after irradiating the cycloolefin polymer material with 200 pulses of the ArF excimer laser beam was further irradiated with 1.35-mW/cm$^2$ (185-nm) ultraviolet light by using the above-mentioned ultraviolet lamp for 1 min at a distance of 3.5 cm from the ultraviolet lamp. In this case, the cumulative exposure amount was 1.35 mW/cm$^2$×60 sec=81 mJ/cm$^2$.

The surface modification status of the substrate thus irradiated with the ultraviolet light was analyzed by XPS measurement. The oxygen atom existence ratio of the portion on the substrate, which was irradiated with the laser beam, was 20.1% after irradiation with the ultraviolet lamp. Also, the oxygen atom existence ratio of the portion on the substrate, which was not irradiated with the laser beam, was 12.6% after irradiation by the ultraviolet lamp. In Experiment 1, the oxygen atom existence ratio was suppressed to 15% or less in the portion on the substrate, which was not irradiated with the laser beam. As will be described later, therefore, it was possible to selectively deposit a plating metal in the laser beam-irradiated portion.

Plating Step

Then, a plating step of performing electroless plating on the substrate irradiated with the ultraviolet light in the oxidation step was performed. As an electroless plating solution, Cu—Ni plating solution set "AISL" manufactured by JCU was used. Table 6 shows practical processes in the plating step.

TABLE 6

| Step | Process Conditions | Remarks |
|---|---|---|
| Alkali Treatment | 50° C., 2 min | Degreasing and Wettability Improved |
| Water Washing + Drying (Air Blow) | | |
| Conditioner Step | 50° C., 2 min | Binder between Catalyst Ions and Substrate Was Given |
| Hot Water Washing + Water Washing + Drying (Air Blow) | | |
| Activator | 50° C., 2 min | Catalyst Ions Were Given |
| Water Washing + Drying (Air Blow) | | |
| Accelerator | 40° C., 2 min | Metal Was Formed by Reducing Catalyst Ions |
| Water Washing + Drying (Air Blow) | | |
| Electroless Cu—Ni Plating | 60° C., 5 min | Electroless Plating Metal Was Deposited |
| Water Washing + Drying (Air Blow) | | |

When electroless plating was performed in accordance with the steps shown in Table 6, a metal film was formed in only the laser beam-irradiated portion by electroless plating.

Experiment 2

An irradiation step, oxidation step, and plating step were performed following the same procedures as in Experiment 1 except that the number of times of laser beam irradiation was changed in the irradiation step, and whether a metal film was formed in the laser beam-irradiated portion was observed. Table 7 shows the results. In Table 7, ○ indicates that a plating metal was deposited, and x indicates that no plating metal was deposited.

TABLE 7

| Oxygen Atom Existence Ratio after Laser Beam Irradiation | Cumulative Irradiation Amount in Oxidation Step 81 mJ/cm² (1-min Irradiation) |
|---|---|
| 0.0% | x |
| 3.8% | x |
| 4.2% | x |
| 7.1% | ○ |
| 8.8% | ○ |

As shown in Table 7, when 81-mJ/cm² ultraviolet light was emitted in the oxidation step, a plating metal was deposited on the laser beam-irradiated portion by setting the oxygen atom existence ratio in the laser beam-irradiated portion at 6.5% or more in the irradiation step. More specifically, the oxygen atom existence ratio was 6.5% or more when the number of pulses was 20 or more in Experiment 2 in which the ArF excimer laser beam having an energy density of 100 mJ/cm² was emitted. Since it is conceivable that the oxygen atom existence ratio does not decrease even when the number of pulses is increased, the number of pulses presumably has no upper limit. However, the oxygen atom existence ratio was 6.5% or more when the number of pulses was 200 or less.

Experiment 3

An irradiation step, oxidation step, and plating step were performed following the same procedures as in Experiment 1 except that the number of times of laser beam irradiation was changed in the irradiation step, and ultraviolet light was emitted for 3 min in the oxidation step, and whether a metal film was formed in the laser beam-irradiated portion was observed. Table 8 shows the results. In Table 8, ○ indicates that a plating metal was deposited, and x indicates that no plating metal was deposited.

TABLE 8

| Oxygen Atom Existence Ratio after Laser Beam Irradiation | Cumulative Irradiation Amount in Oxidation Step 243 mJ/cm² (3-min Irradiation) |
|---|---|
| 0.0% | x |
| 3.8% | ○ |
| 4.2% | ○ |
| 7.1% | ○ |
| 8.8% | ○ |

As shown in Table 8, when 243-mJ/cm² ultraviolet light was emitted in the oxidation step, a plating metal was deposited in the laser beam-irradiated portion by setting the oxygen atom existence ratio in the laser beam-irradiated portion at 3.0% or more in the irradiation step.

Example 1

An insulating resin sheet of a cycloolefin polymer material (Zeonor Film ZF-16 manufactured by ZEON, film thickness=100 μm, and surface roughness=1.01 nm) was used as a first resin layer 100.

First, portions 210 for forming electrode patterns 110 on the first resin layer 100 were irradiated with an ultraviolet laser beam by scanning the portions for forming the electrode patterns 110 on the first resin layer 100 by an ArF excimer laser beam (wavelength=193 nm). More specifically, a plurality of rectangular portions 210 shown in FIG. 2 were irradiated with the ultraviolet laser beam.

The laser beam irradiation conditions of the rectangular portions 210 were as follows.
Ultraviolet laser beam irradiation apparatus:
  LPXpro 210 manufactured by COHERENT
Irradiation conditions:
  frequency=100 Hz, pulse width=25 ns
Irradiation surface energy density per pulse:
  1,000 mJ/cm²
Total amount of irradiation energy:
  20 pulses, total of 20,000 mJ/cm²
Recesses 140 were formed in the portions irradiated with the ultraviolet laser beam. The depth of the recess 140 was measured by a stylus step profiler and found to be about 2 μm.

Then, perforations 150 were formed by irradiating the first resin layer 100 with the ultraviolet laser beam. More specifically, circular regions 220A and 220B having a diameter of 50 μm shown in FIG. 2 were irradiated with 300 pulses of the ultraviolet laser beam. The laser beam irradiation conditions were the same as the ultraviolet laser beam irradiation conditions of the portions 210 except for the number of pulses and the total amount of irradiation energy.

Thereafter, the region including the portions 210 on the first resin layer 100 was oxidized by irradiating the entire surface of the first resin layer 100 with ultraviolet light by using a low-pressure mercury lamp. In this step, even the side surfaces of the perforations 150 were irradiated with the ultraviolet light because of scattering of the ultraviolet light.

The irradiation conditions of the ultraviolet light were as follows.
Low-pressure mercury lamp:
  UV-300 (main wavelength=185 nm, 254 nm) manufactured by SAMCO
Irradiation distance: 3.5 cm
Illumination immediately below lamp:
  5.40 mW/cm² (254 nm)
Irradiation time: 3 min
Then, electroless plating was performed on the first resin layer 100. As an electroless plating solution, Cu—Ni plating solution set "AISL" manufactured by JCU was used. More specifically, plating was performed as shown in Table 6 described above. When electroless plating was performed, metal films were formed only in the recesses 140 and on the side surfaces of the perforations 150 by electroless plating.

Subsequently, the thickness of the plating film was increased by performing electroplating on the first resin layer 100. More specifically, plating was performed by using a plating solution set (CU-BRITE RF) manufactured by JCU, until the surface of the plating film formed in the recess 140 was projected from the surface of the first resin layer 100 and the perforation 150 was filled with the deposited metal. After that, the first resin layer 100 and the plating film formed on it were polished by chemical mechanical polishing (CMP) to smooth a surface of the first resin layer 100 that was irradiated with the ultraviolet laser beam, that is, the plating film-formed surface. As a result, the electrode patterns 110 buried in the recesses 140 of the first resin layer 100 were formed.

Finally, a second resin layer 130 (vinyl chloride resin manufactured by Mitsubishi Plastics, thickness=100 μm) was adhered to a surface of the first resin layer 100 on which the electrode patterns 110 were formed, thereby completing an electrostatic adsorptive belt 190. The electrostatic adsorptive belt 190 had a smooth surface as a result of a visual check.

Example 2

An electrostatic adsorptive belt 700 according to the second embodiment was fabricated by the following method.

Electrodes 721 to 728 in this example were arranged as shown in FIG. 8. An insulating resin sheet of a cycloolefin polymer material (Zeonor Film ZF-16 manufactured by ZEON, film thickness=100 μm) was used as a first resin layer 710.

First, portions for forming electrodes 721 to 728 on the first resin layer 710 were irradiated with an ultraviolet laser beam by scanning the portions for forming the electrodes 721 to 728 on the first resin layer 710 by an ArF excimer laser beam (wavelength=193 nm). In this example, the width of each of electrodes 721 to 728 to be formed was 0.5 mm. The interval between the electrodes 721 to 728 adjacent in the lengthwise direction of the electrostatic adsorptive belt 700 was 0.5 mm.

The laser beam irradiation conditions were as follows.
Ultraviolet laser beam irradiation apparatus:
  LPXpro 210 manufactured by COHERENT
Irradiation conditions:
  frequency=100 Hz, pulse width=25 ns
Irradiation surface energy density per pulse:
  1,000 mJ/cm$^2$
Total amount of irradiation energy:
  10 pulses, total of 10,000 mJ/cm$^2$ Recesses were formed in the portions irradiated with the ultraviolet laser beam. The depth of the recess was measured by a stylus step profiler and found to be about 1 μm.

Then, portions for forming power feeders 741A to 748A and 741B to 748B of the first resin layer 710 were irradiated with 300 pulses of the ultraviolet laser beam, thereby forming perforations. The laser beam irradiation conditions were the same as the ultraviolet laser beam irradiation conditions of the portions for forming the electrodes 721 to 728, except for the number of pulses and the total amount of irradiation energy. The formed perforation had a diameter of 50 μm.

After that, an oxidation process was performed by irradiating the entire surface of the first resin layer 710 with ultraviolet light by using a low-pressure mercury lamp. In this step, even the side surfaces of the perforations were irradiated with the ultraviolet light because of scattering of the ultraviolet light.

The irradiation conditions of the ultraviolet light were as follows.
Low-pressure mercury lamp:
  UV-300 (main wavelength=185 nm, 254 nm) manufactured by SAMCO
Irradiation distance: 3.5 cm
Illumination immediately below lamp:
  5.40 mW/cm$^2$ (254 nm)
Irradiation time: 3 min Then, electroless plating was performed on the first resin layer 710. As an electroless plating solution, Cu—Ni plating solution set "AISL" manufactured by JCU was used. More specifically, plating was performed as shown in Table 9. When electroless plating was performed, metal films were formed only in the recesses and on the side surfaces of the perforations by electroless plating.

TABLE 9

| Step | Process Conditions | Remarks |
| --- | --- | --- |
| Alkali Treatment | 50° C., 2 min | Degreasing and Wettability Improved |
| Water Washing + Drying (Air Blow) | | |
| Conditioner Step | 50° C., 2 min | Binder between Catalyst Ions and Substrate Was Given |
| Hot Water Washing + Water Washing + Drying (Air Blow) | | |
| Activator | 50° C., 2 min | Catalyst Ions Were Given |
| Water Washing + Drying (Air Blow) | | |
| Accelerator | 40° C., 2 min | Metal Was Formed by Reducing Catalyst Ions |
| Water Washing + Drying (Air Blow) | | |
| Electroless Cu—Ni Plating | 60° C., 5 min | Electroless Plating Metal Was Deposited |
| Water Washing + Drying (Air Blow) | | |

Subsequently, the thickness of the plating film was increased by performing electroplating on the first resin layer 710. More specifically, plating was performed by using a plating solution set "CU-BRITE RF" manufactured by JCU, until the surface of the plating film formed in the recess was projected from the surface of the first resin layer 710 and the perforation was filled with the deposited metal. After that, the first resin layer 710 and the plating film formed on it were polished by chemical mechanical polishing (CMP) to smooth a surface of the first resin layer 710 that was irradiated with the ultraviolet laser beam, that is, the plating film-formed surface. Consequently, the electrodes 721 to 728 buried in the recesses of the first resin layer 710 were formed.

Finally, a second resin layer 730 (a cycloolefin polymer material "Zeonor" manufactured by ZEON, thickness=100 μm) was adhered to a surface of the first resin layer 710 on which the electrodes 721 to 728 were formed, thereby completing an electrostatic adsorptive belt 700. The electrostatic adsorptive belt 700 had a smooth surface as a result of a visual check.

Example 3

An electrostatic adsorptive belt 1200 according to the third embodiment was fabricated by the following method. Electrodes 1221 and 1222 in this example were arranged as shown in FIG. 12A. In this example, the line width of meshes constituting electrodes 1221 to 1222 was 25 μm, and the interval of the mesh was 50 μm.

The same processes as those in Example 2 were performed in accordance with the shape of the electrodes 1221 and 1222 shown in FIG. 12A except that the irradiation amount of an ultraviolet laser beam to portions for forming the electrodes 1221 and 1222 was 15 pulses, that is, a total of 15,000 mJ/cm$^2$. It was possible to fabricate the electrostatic adsorptive belt 1200 having the mesh electrode pattern according to the third embodiment.

Example 4

An electrostatic adsorptive belt 1300 according to the fourth embodiment was fabricated by the following method. Electrodes 1321 and 1322 in this example were arranged as shown in FIG. 13. In this example, the width of each of electrodes 1321 and 1322 to be formed was 0.3 mm. The interval between the electrodes 1321 and 1322 adjacent in the lengthwise direction of the electrostatic adsorptive belt 1300 was 0.8 mm. Further, conductive films 1311 and 1312 had a circular shape with a diameter of 50 μm.

The same processes as those in Example 3 were performed in accordance with the shape of the electrodes 1321 and 1322 shown in FIG. 13. It was possible to fabricate the electrostatic adsorptive belt 1300 further having the conductive films according to the fourth embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2013-229761, filed Nov. 5, 2013, No. 2013-229763, filed Nov. 5, 2013, and No. 2014-219664, filed Oct. 28, 2014, which are hereby incorporated by reference herein in their entirety.

What is claimed is:

1. A method of manufacturing an electrostatic adsorptive belt, comprising:
   irradiating, with an ultraviolet laser beam, a portion for forming an electrode pattern on a first resin layer;
   oxidating a region including the portion for forming the electrode pattern on the first resin layer;
   forming the electrode pattern on the first region layer by plating; and
   forming a second resin layer on a surface of the first resin layer on which the electrode pattern is formed.

2. The method according to claim 1, wherein the ultraviolet laser beam has a wavelength of not more than 243 nm.

3. The method according to claim 1, wherein in the oxidating, ultraviolet light having a wavelength of not more than 243 nm is emitted by using an ultraviolet lamp.

4. The method according to claim 1, wherein
   the ultraviolet laser beam has a wavelength of not more than 243 nm,
   in the oxidating, ultraviolet light having a wavelength of not more than 243 nm is emitted, and
   the irradiating and the oxidating are performed in an atmosphere containing at least one of oxygen or ozone.

5. The method according to claim 1, further comprising, before forming the electrode pattern, forming a perforation in the portion for forming the electrode pattern on the first resin layer.

6. The method according to claim 5, wherein in forming the perforation, the perforation is formed by irradiation with the ultraviolet laser beam.

7. The method according to claim 1, further comprising, before forming the second resin layer and after forming the electrode pattern, smoothing a surface of a laminate comprising the first resin layer and the electrode pattern, on which the electrode pattern is formed.

8. The method according to claim 1, wherein the first resin layer contains at least one material selected from the group consisting of cycloolefin polymer, polystyrene, polyethylene terephthalate, and polyvinyl chloride.

* * * * *